US012764917B2

(12) United States Patent
Mikami

(10) Patent No.: US 12,764,917 B2
(45) Date of Patent: Oct. 13, 2026

(54) ELECTROMAGNETIC WAVE SHIELDING MATERIAL, ELECTRONIC COMPONENT, ELECTRONIC APPARATUS, AND USING METHOD FOR ELECTROMAGNETIC WAVE SHIELDING MATERIAL

(71) Applicant: FUJIFILM Corporation, Tokyo (JP)

(72) Inventor: Tatsuo Mikami, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 14 days.

(21) Appl. No.: 18/646,926

(22) Filed: Apr. 26, 2024

(65) Prior Publication Data

US 2024/0298433 A1 Sep. 5, 2024

Related U.S. Application Data

(63) Continuation of application No. PCT/JP2022/039512, filed on Oct. 24, 2022.

(30) Foreign Application Priority Data

Oct. 29, 2021 (JP) ................................ 2021-178045

(51) Int. Cl.
*H05K 9/00* (2006.01)

(52) U.S. Cl.
CPC ................................. *H05K 9/0088* (2013.01)

(58) Field of Classification Search
CPC .................................................... H05K 9/0088
See application file for complete search history.

(56) References Cited

U.S. PATENT DOCUMENTS

| | | | | |
|---|---|---|---|---|
| 8,415,568 B1 * | 4/2013 | Hansen | .................... | H05K 9/00 174/394 |
| 2020/0359534 A1 * | 11/2020 | Perry | ..................... | H05K 9/003 |
| 2024/0107728 A1 * | 3/2024 | Mikami | ............... | H05K 9/0088 |
| 2024/0153685 A1 * | 5/2024 | Yamamoto | ........... | H05K 9/0088 |

FOREIGN PATENT DOCUMENTS

| | | |
|---|---|---|
| JP | 3-6898 A | 1/1991 |
| JP | 2014-232842 A | 12/2014 |

(Continued)

OTHER PUBLICATIONS

International Preliminary Report on Patentability dated Apr. 30, 2024 with a Translation of the Written Opinion of the International Searching Authority in Application No. PCT/JP2022/039512.

(Continued)

*Primary Examiner* — Hung V Ngo
(74) *Attorney, Agent, or Firm* — Sughrue Mion, PLLC

(57) ABSTRACT

There are provided an electromagnetic wave shielding material, where the electromagnetic wave shielding material is a laminate in which both outermost layers are metal layers and one or more magnetic layers are provided, and the electromagnetic wave shielding material has a penetrating part that penetrates from a position on one side surface of the laminate to a position on the other side surface thereof, an electronic component and an electronic apparatus which include the electromagnetic wave shielding material, and a using method for the electromagnetic wave shielding material.

11 Claims, 6 Drawing Sheets

(56) References Cited

FOREIGN PATENT DOCUMENTS

| | | |
|---|---|---|
| JP | 2017-212239 A | 11/2017 |
| JP | 2021-68279 A | 4/2021 |

OTHER PUBLICATIONS

International Search Report dated Jan. 24, 2023 in Application No. PCT/JP2022/039512.

Written Opinion of the International Searching Authority dated Jan. 24, 2023 in International Application No. PCT/JP2022/039512.

Communication dated Jul. 7, 2026, in Japanese Application No. 2023-556425.

* cited by examiner

ELECTROMAGNETIC WAVE SHIELDING MATERIAL, ELECTRONIC COMPONENT, ELECTRONIC APPARATUS, AND USING METHOD FOR ELECTROMAGNETIC WAVE SHIELDING MATERIAL

CROSS-REFERENCE TO RELATED APPLICATIONS

This application is a Continuation of PCT International Application No. PCT/JP2022/039512 filed on Oct. 24, 2022, which claims priority under 35 U.S.C. § 119(a) to Japanese Patent Application No. 2021-178045 filed on Oct. 29, 2021. Each of the above applications is hereby expressly incorporated by reference, in its entirety, into the present application.

BACKGROUND OF THE INVENTION

1. Field of the Invention

The present invention relates to an electromagnetic wave shielding material, an electronic component, an electronic apparatus, and a using method for an electromagnetic wave shielding material.

2. Description of the Related Art

An electromagnetic wave shielding material has attracted attention as a material for reducing the influence of an electromagnetic wave in various electronic components and various electronic apparatuses (sec, for example, JP1991-6898A (JP-H3-6898A).

SUMMARY OF THE INVENTION

An electromagnetic wave shielding material (hereinafter, also described as a "shielding material") is capable of exhibiting the performance of shielding electromagnetic waves (shielding ability) by reflecting electromagnetic waves incident on the shielding material by the shielding material and/or by attenuating the electromagnetic waves in the inside the shielding material.

The following two performances can be mentioned as the performance desired for the electromagnetic wave shielding material.

The first is that a high shielding ability can be exhibited against electromagnetic waves. An electromagnetic wave shielding material that exhibits a high shielding ability against electromagnetic waves is desirable since it can contribute to significantly reducing the influence of electromagnetic waves on an electronic component and an electronic apparatus. Regarding this point, according to the study by the inventors of the present invention, further improvement in the shielding ability against a magnetic field wave among electromagnetic waves is desired in many electromagnetic wave shielding materials in the related art.

The second is that bending performance is excellent. The shielding material can be processed by being bent into a shape according to a use application. In a case where the width of the curved portion (hereinafter, referred to as a "curve width") is widened in a case where the shielding material is bent, the shape of the curved portion is gently curved, and it may be difficult to process the shielding material into an intended shape. From this point, the curve width is desirably narrow in the shielding material. A case of being capable of being bent to have a narrow curve width shall be referred to as the bending performance is excellent.

In consideration of the above circumstances, an object of one aspect of the present invention is to provide an electromagnetic wave shielding material that is capable of exhibiting a high shielding ability against electromagnetic waves particularly against a magnetic field wave and is excellent in bending performance.

An aspect of the present invention is as follows.

[1] An electromagnetic wave shielding material, in which the electromagnetic wave shielding material is a laminate in which both outermost layers are metal layers and one or more magnetic layers are provided, and the electromagnetic wave shielding material has a penetrating part that penetrates from a position on one side surface of the laminate to a position on the other side surface thereof.

[2] The electromagnetic wave shielding material according to [1], in which the penetrating part is a through-hole.

[3] The electromagnetic wave shielding material according to [2], in which the through-hole is provided in a portion other than the metal layers as both outermost layers.

[4] The electromagnetic wave shielding material according to [1], in which the penetrating part is provided in a portion other than one metal layer of both outermost layers.

[5] The electromagnetic wave shielding material according to [4], in which the penetrating part is a penetrating groove that is located at least in the other metal layer of both outermost layers.

[6] The electromagnetic wave shielding material according to [1], in which the penetrating part is a penetrating groove that is located only in one metal layer of both outermost layers.

[7] The electromagnetic wave shielding material according to any one of [1] to [6], in which a width of the penetrating part is 1.0 mm or less.

[8] The electromagnetic wave shielding material according to any one of [1] to [7], in which the laminate includes, in the following order;

a metal layer as one outermost layer, a magnetic layer, and a metal layer as the other outermost layer.

[9] The electromagnetic wave shielding material according to any one of [1] to [7], in which the laminate includes, in the following order;

a metal layer as one outermost layer, a magnetic layer, an additional metal layer, a magnetic layer, and a metal layer as the other outermost layer.

[10] An electronic component comprising:

the electromagnetic wave shielding material according to any one of [1] to [9].

[11] The electronic component according to [10], in which the electromagnetic wave shielding material is disposed at a position at which a direction of a magnetic field is orthogonal to a penetration direction of the penetrating part.

[12] An electronic apparatus comprising:

the electromagnetic wave shielding material according to any one of [1] to [9].

[13] The electronic apparatus according to [12], in which the electromagnetic wave shielding material is disposed at a position at which a direction of a magnetic field is orthogonal to a penetration direction of the penetrating part.

[14] A using method for the electromagnetic wave shielding material according to any one of [1] to [9], in which the electromagnetic wave shielding material is disposed at a position at which a direction of a magnetic field is orthogonal to a penetration direction of the penetrating part.

According to one aspect of the present invention, it is possible to provide an electromagnetic wave shielding material that is capable of exhibiting a high shielding ability against electromagnetic waves particularly against a magnetic field wave and is excellent in bending performance, and to provide a using method for the electromagnetic wave shielding material. In addition, according to one aspect of the present invention, it is possible to provide an electronic component and an electronic apparatus, which include the electromagnetic wave shielding material.

DESCRIPTION OF THE PREFERRED EMBODIMENTS

Electromagnetic Wave Shielding Material

Figure 1:
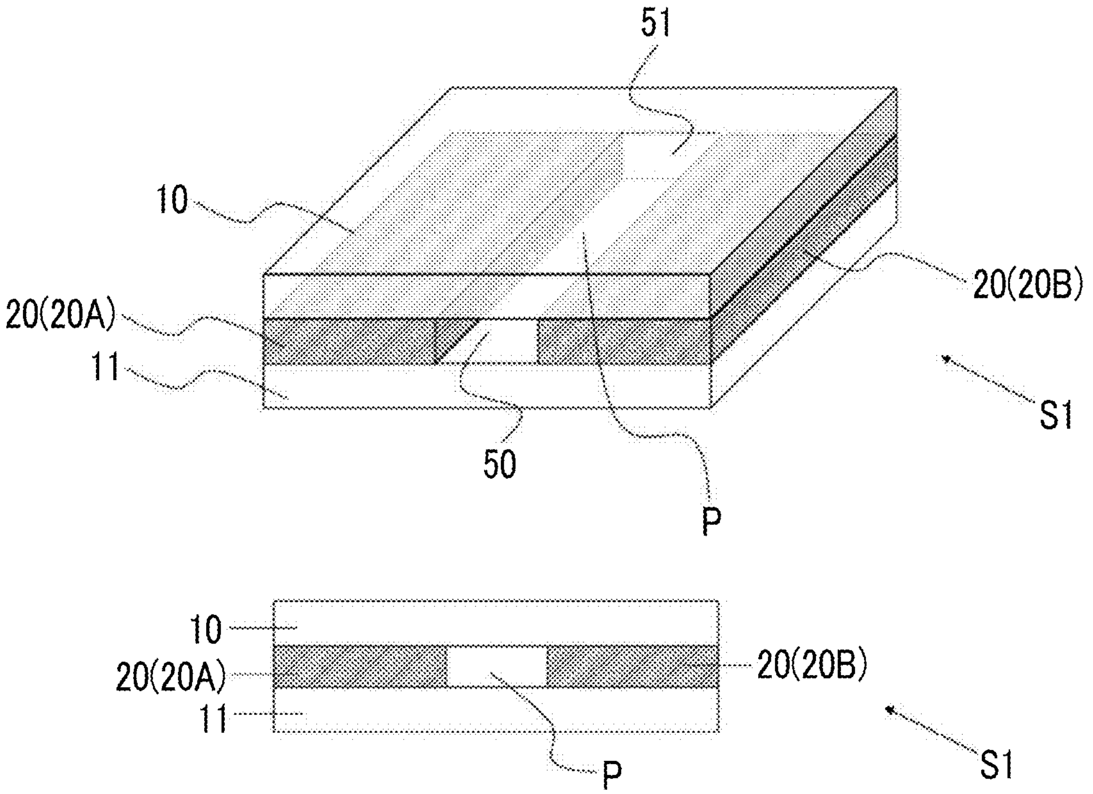
FIG. 1 shows an example of an electromagnetic wave shielding material having a penetrating part.

One aspect of the present invention relates to an electromagnetic wave shielding material, where the electromagnetic wave shielding material is a laminate in which both outermost layers are metal layers and one or more magnetic layers are provided, and the electromagnetic wave shielding material has a penetrating part that penetrates from a position on one side surface of the laminate to a position on the other side surface thereof.

In the present invention and the present specification, the "electromagnetic wave shielding material" shall refer to a material that is capable of exhibiting shielding ability against an electromagnetic wave of at least one frequency or at least a part of a range of a frequency band. The "electromagnetic wave" includes a magnetic field wave and an electric field wave. The "electromagnetic wave shielding material" is preferably a material that is capable of exhibiting shielding ability against one or both of a magnetic field wave of at least one frequency or at least a part of a range of a frequency band and an electric field wave of at least one frequency or at least a part of a range of a frequency band.

In the present invention and the present specification, "magnetic" means having a ferromagnetic property. Details of the magnetic layer will be described later.

In the present invention and the present specification, the "metal layer" shall refer to a layer containing a metal. The metal layer can be a layer containing one or more kinds of metals as a pure metal consisting of a single metal element, as an alloy of two or more kinds of metal elements, or as an alloy of one or more kinds of metal elements and one or more kinds of non-metal elements. Details of the metal layer will be described later.

Regarding the electromagnetic wave shielding material, the inventors of the present invention presume that the reason why the electromagnetic wave shielding material is capable of exhibiting a high shielding ability against electromagnetic waves is due to the fact that both outermost layers of the electromagnetic wave shielding material are metal layers, where the electromagnetic wave shielding material has a laminated structure in which a magnetic layer is sandwiched between these two metal layers. The details are as follows. In order to obtain a high shielding ability against electromagnetic waves in the electromagnetic wave shielding material, it is desirable to increase the reflection at the interface in addition to increasing the ability to attenuate electromagnetic waves. That is, it is desirable that the electromagnetic wave repeatedly reflects at the interface and passes through the shielding material a large number of times to be largely attenuated. However, as the behavior of the metal layer and the magnetic layer with respect to the electromagnetic wave, the reflection of the magnetic field wave at the interface tends to be small although the metal layer has a large ability to attenuate the electromagnetic wave, and the reflection of the magnetic field wave at the interface tends to be larger than that in the metal layer although the magnetic layer has a smaller ability to attenuate the electromagnetic wave than the metal layer. Therefore, with the metal layer alone or the magnetic layer alone, it is difficult to achieve both high reflection and high attenuation of, particularly, the magnetic field wave among the electromagnetic waves. In contrast, due to including a laminated structure having the magnetic layer between two metal layers, the electromagnetic wave shielding material makes it possible to achieve both the above-described reflection at the interface and the above-described attenuation within the layer. The inventors of the present invention conceive this fact is the reason why the electromagnetic wave shielding material is capable of exhibiting a high shielding ability against magnetic field waves.

However, it is difficult to bend the electromagnetic wave shielding material having the above-described laminated structure due to the fact that the thickness increases due to the lamination of a plurality of layers and/or the fact that the metal layer and the magnetic layer are usually different in terms of elongatability, and thus the curve width is likely to be increased. In contrast, the electromagnetic wave shielding material has a penetrating part, the details of which will be described later. An electromagnetic wave shielding material having such a penetrating part can be bent in a case of carrying out bending, by using the position of the penetrating part as a so-called folding line, and in a case of being bent in this way, the electromagnetic wave shielding material can be bent to have a curve width narrower than that of an electromagnetic wave shielding material that does not have a penetrating part. This point has been newly found as a result of the intensive studies by the inventors of the present invention.

The above point is the speculation of the inventors of the present invention regarding the reason why the electromagnetic wave shielding material can achieve both a high electromagnetic wave shielding ability and an excellent bending performance. However, the present invention is not limited to the presumption described in the present specification.

Hereinafter, the electromagnetic wave shielding material will be described in more detail.

<Layer Configuration of Laminate and Penetrating Part>

The electromagnetic wave shielding material is a laminate, in which both outermost layers are metal layers and one or more magnetic layers are provided. That is, the electromagnetic wave shielding material has a metal layer which is the one outermost layer, and a metal layer which is the other outermost layer, and it has one or more magnetic layers between the two layers. In one form, each of the above-described metal layers can be a layer that is in direct contact with the magnetic layer. In another form, one or more other layers may be included between each of the above metal layers and the magnetic layer. In addition, the electromagnetic wave shielding material can also have, as layers constituting the laminate, one or more additional metal layers other than the metal layers as both outermost layers. Specific examples of the layer configuration of the laminate will be described below with reference to the drawings. It is noted that the drawing is a schematic view, where the magnitude relationship of the dimensions (the thickness and the like) of the various layers shown in the drawing is merely an example and thus does not limit the present invention.

FIGS. 1 to 6 each show an example of an electromagnetic wave shielding material having a penetrating part. In each figure, the upper figure is a perspective view of an electromagnetic wave shielding material, and the lower figure is a cross-sectional view of the electromagnetic wave shielding material in a thickness direction.

An electromagnetic wave shielding material S1 illustrated in FIG. 1 includes a metal layer 10 which is the one outermost layer, a magnetic layer 20, and a metal layer 11 which is the other outermost layer. Details of the metal layer and the magnetic layer will be described later. The electromagnetic wave shielding material S1 may have or may not have one or more other layers (not illustrated in the drawing) between the metal layer 10 and the magnetic layer 20 and/or between the metal layer 11 and the magnetic layer 20. This point also applies to the electromagnetic wave shielding material illustrated in various drawings described later. Examples of the other layer include a pressure-sensitive adhesive layer and an adhesive layer, which will be described later.

Figure 8:
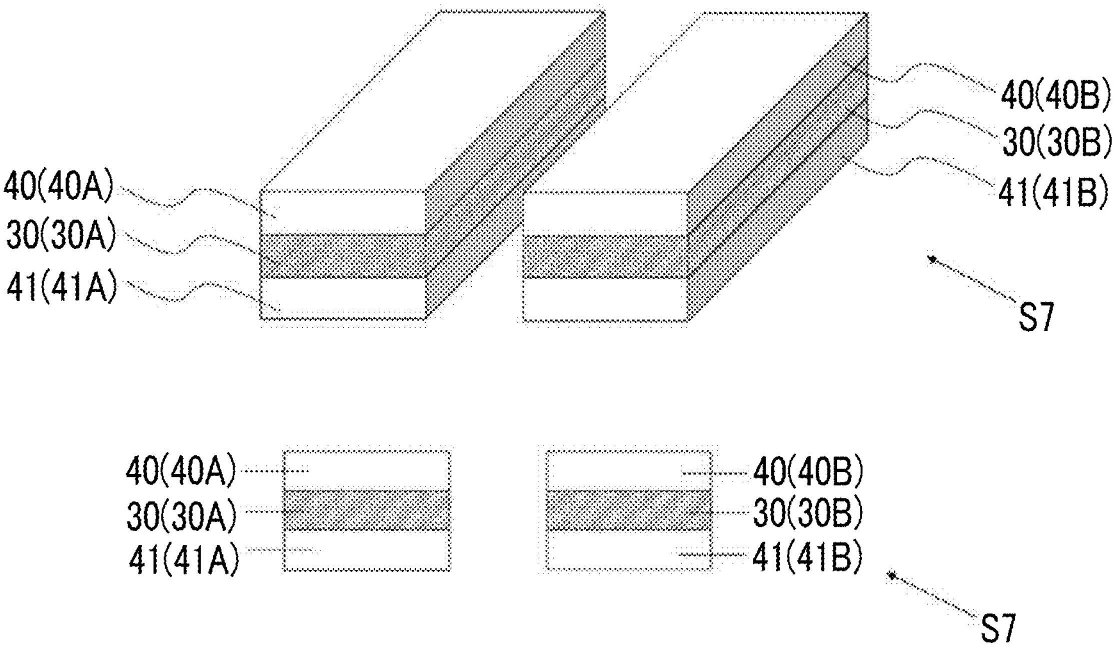
FIG. 8 shows an example of an electromagnetic wave shielding material that does not have a penetrating part.
Figure 9:
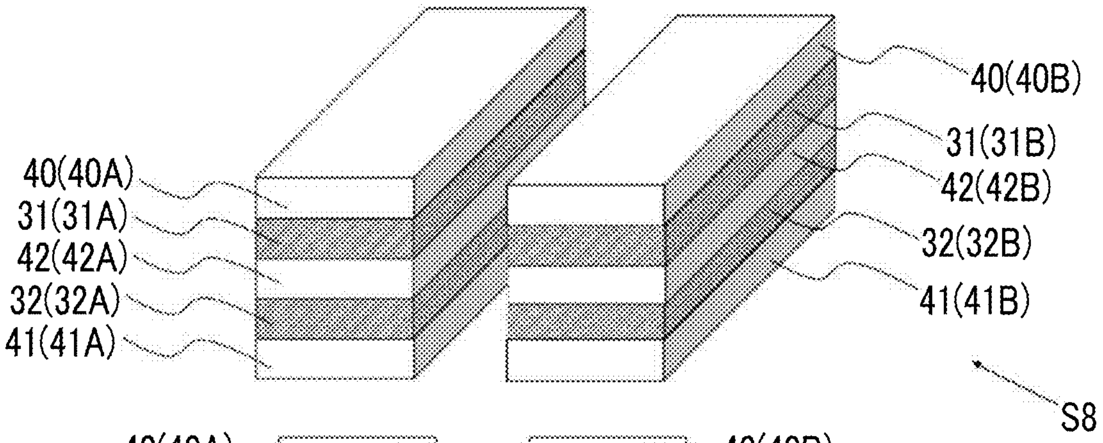
FIG. 9 shows an example of an electromagnetic wave shielding material that does not have a penetrating part.
Figure 9:
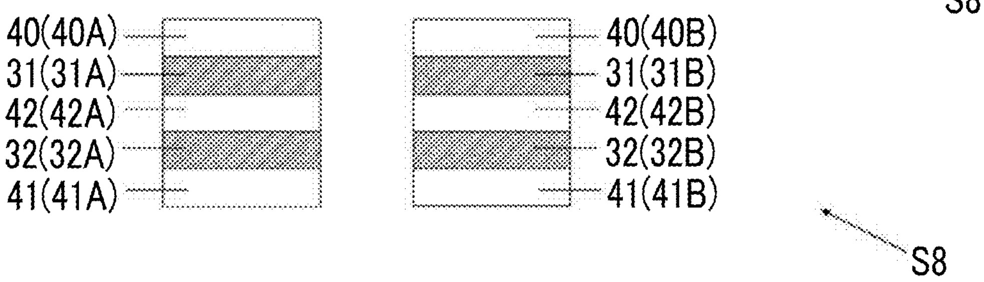

The electromagnetic wave shielding material S1 illustrated in FIG. 1 has a penetrating part P that penetrates from a position on one side surface of the laminate to a position on the other side surface thereof. In the present invention and the present specification, the "penetrating part" includes a through-hole and a penetrating groove. The through-hole is a hole portion that does not have an opening portion that is opened to the outside of the laminate, for example, like the penetrating part P in FIG. 1. In contrast, the penetrating groove is a recessed part that has an opening portion that is opened to the outside of the laminate, for example, like the penetrating part P in FIG. 3 described later. The "penetrating part" in the present invention and the present specification does not include such one that completely divides a laminate by dividing all layers included in the laminate, for example, as illustrated in FIGS. 8 and 9 which will be described later.

The penetrating part penetrates from a position on one side surface of the laminate to a position on the other side surface thereof. The electromagnetic wave shielding material is a laminate, and in the present invention and the present specification, the "side surface" of the electromagnetic wave shielding material shall refer to a surface of the laminate on the lamination direction side, that is, a surface on the thickness direction side. For example, in a case where a surface (so-called main surface) of one metal layer of the metal layers as both outermost layers of the electromagnetic wave shielding material is called an upper surface of the electromagnetic wave shielding material, and a surface (so-called main surface) of the other metal layer thereof is called a lower surface of the electromagnetic wave shielding material, a surface other than the upper surface and the lower surface of the electromagnetic wave shielding material can be called a side surface. The electromagnetic wave shielding material S1 illustrated in FIG. 1 has a rectangular shape in planar view and has an upper surface which is a surface of the metal layer 10 which is the one outermost layer, a lower surface which is a surface of the metal layer 11 which is the other outermost layer, and four flat surfaces as side surfaces. The penetrating part (through-hole) P penetrates from an opening 50 of one flat surface to an opening 51 of the other flat surface of two flat surfaces facing each other as the side surfaces. Due to the presence of such a penetrating part P, the magnetic layer 20 is divided into a magnetic layer 20A and a magnetic layer 20B in the electromagnetic wave shielding material S1. In contrast, the metal layer 10 and the metal layer 11 as both outermost layers are not divided by the penetrating part P. A layer that is not divided by the penetrating part in this way can be called a continuous layer.

In the examples illustrated in FIGS. 1 to 6, the electromagnetic wave shielding material has a rectangular shape in planar view, where each of the upper surface, the lower surface, and the side surface is a flat surface. However, the shape of the electromagnetic wave shielding material (laminate) in planar view and the surface shape of various surfaces in the present invention are not limited to the examples described above. For example, the shape in planar view may be a circular shape, an elliptical shape, a triangular shape, a polygonal shape of a pentagonal shape or higher polygonal shape, or the like. The upper surface, the lower surface, and the side surfaces may include a curved surface in a part of the surface thereof, or the entire surface thereof may be a curved surface. In addition, a protruding part, a recessed part, or a stepped part, which is formed in a case where an end part of a part of layers constituting the laminate protrudes outward from an end part of at least a part of other layers, may be included in at least a part of the side surface. Regarding the position of the penetrating part, the penetrating part P is disposed in the central part of the electromagnetic wave shielding material in the example illustrated in FIG. 1. However, the position of the penetrating part is not limited to the example described above, and the penetrating part can be provided at any position. For example, it is possible to determine the position at which the penetrating part is disposed in consideration of the shape of the electromagnetic wave shielding material to be subjected to bending processing according to the use application or the like. As an example, a penetrating part that penetrates from an opening of one surface to an opening of the other surface of two adjacent surfaces of the four flat surfaces as the side surfaces can be provided in an electromagnetic wave shielding material having a rectangular shape in planar view. Regarding the opening shape of the penetrating part, the opening shape is a rectangular shape in the example illustrated in FIG. 1. However, the opening shape of the through-hole is not limited to the example described above and may be a circular shape, an elliptical shape, a triangular shape, a polygonal shape of a pentagonal shape or higher polygonal shape, or the like.

Figure 2:
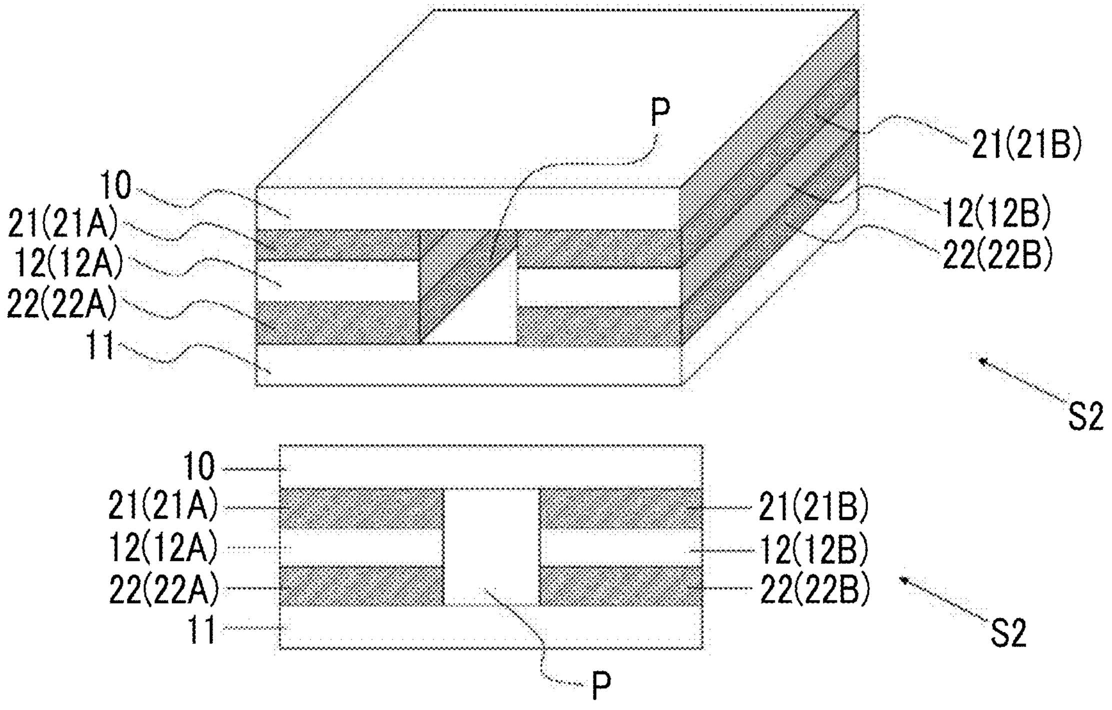
FIG. 2 shows an example of an electromagnetic wave shielding material having a penetrating part.

An electromagnetic wave shielding material S2 illustrated in FIG. 2 includes the metal layer 10 which is the one outermost layer, a magnetic layer 21, an additional metal layer 12, a magnetic layer 22, and the metal layer 11 which is the other outermost layer. In the electromagnetic wave shielding material S2 illustrated in FIG. 2, the penetrating part (through-hole) P penetrates from an opening of one flat surface to an opening of the other flat surface of two flat surfaces facing each other as the side surfaces among the four flat surfaces. Due to the presence of such a penetrating part P, in the electromagnetic wave shielding material S2, the magnetic layer 21 is divided into a magnetic layer 21A and a magnetic layer 21B, the metal layer 12 is divided into a metal layer 12A and a metal layer 12B, and the magnetic layer 22 is divided into a magnetic layer 22A and a magnetic layer 22B. In contrast, the metal layer 10 and the metal layer 11 as both outermost layers are continuous layers.

Figure 3:
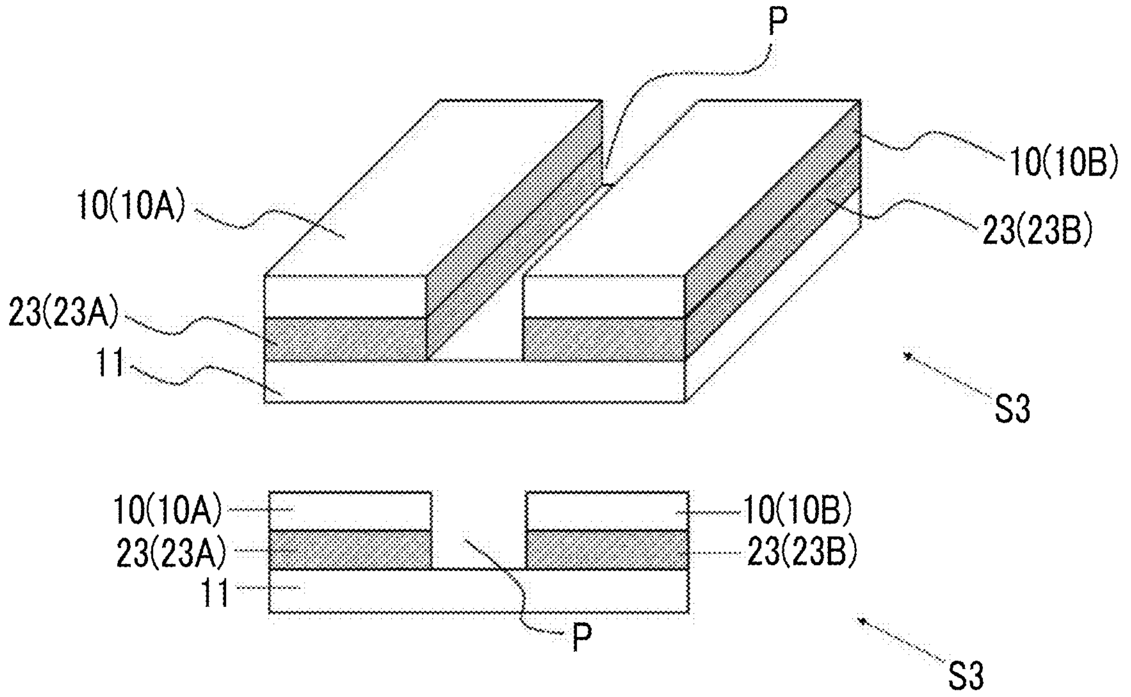
FIG. 3 shows an example of an electromagnetic wave shielding material having a penetrating part.

An electromagnetic wave shielding material S3 illustrated in FIG. 3 includes the metal layer 10 which is the one outermost layer, a magnetic layer 23, and the metal layer 11 which is the other outermost layer. In the electromagnetic wave shielding material S3 illustrated in FIG. 3, the penetrating part P is a penetrating groove, where the one outermost layer (metal layer 10) side is opened to the outside of the laminate. Due to the presence of such a penetrating part (penetrating groove) P, in the electromagnetic wave shielding material S3, the metal layer 10 is divided into a metal layer 10A and a metal layer 10B, and the magnetic layer 23 is divided into a magnetic layer 23A and a magnetic layer 23B. In contrast, the metal layer 11 is a continuous layer.

Figure 4:
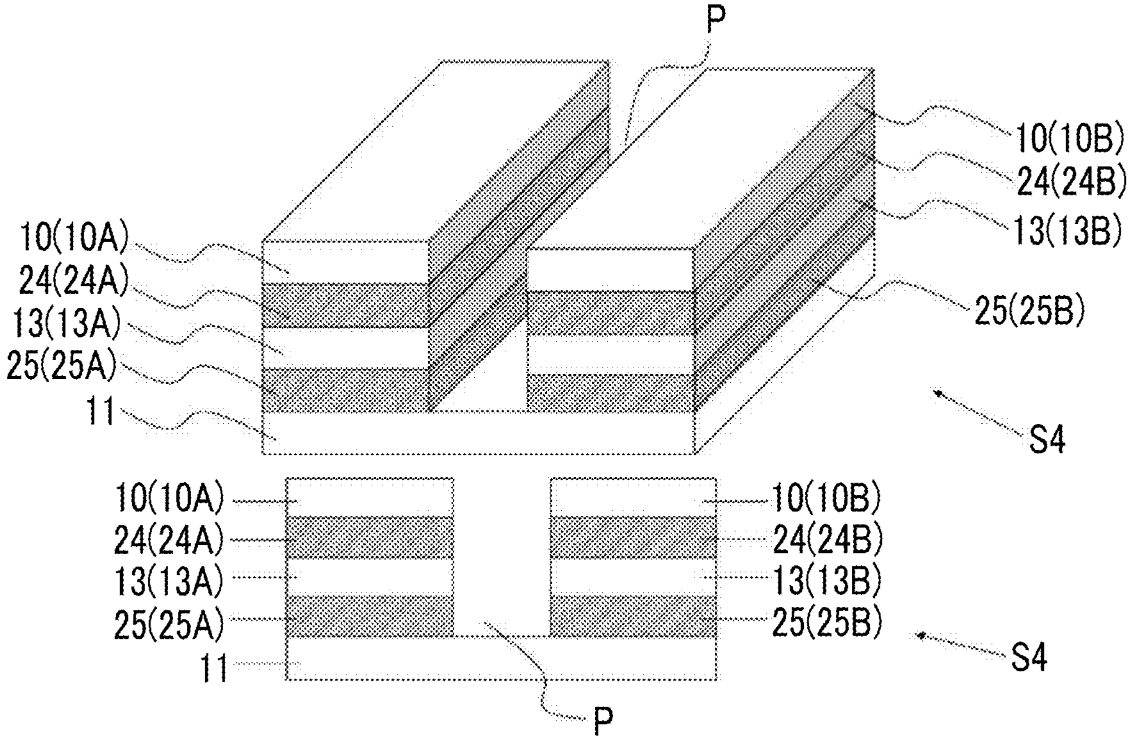
FIG. 4 shows an example of an electromagnetic wave shielding material having a penetrating part.

An electromagnetic wave shielding material S4 illustrated in FIG. 4 includes the metal layer 10 which is the one outermost layer, a magnetic layer 24, an additional metal layer 13, a magnetic layer 25, and the metal layer 11 which is the other outermost layer. In the electromagnetic wave shielding material S4 illustrated in FIG. 4, the penetrating part P is a penetrating groove, where the one outermost layer (metal layer 10) side is opened to the outside of the laminate. Due to the presence of such a penetrating part (penetrating groove) P, in the electromagnetic wave shielding material S4, the metal layer 10 is divided into a metal layer 10A and a metal layer 10B, the magnetic layer 24 is divided into a magnetic layer 24A and a magnetic layer 24B, the metal layer 13 is divided into a metal layer 13A and a metal layer 13B, and the magnetic layer 25 is divided into a magnetic layer 25A and a magnetic layer 25B. In contrast, the metal layer 11 is a continuous layer.

Figure 5:
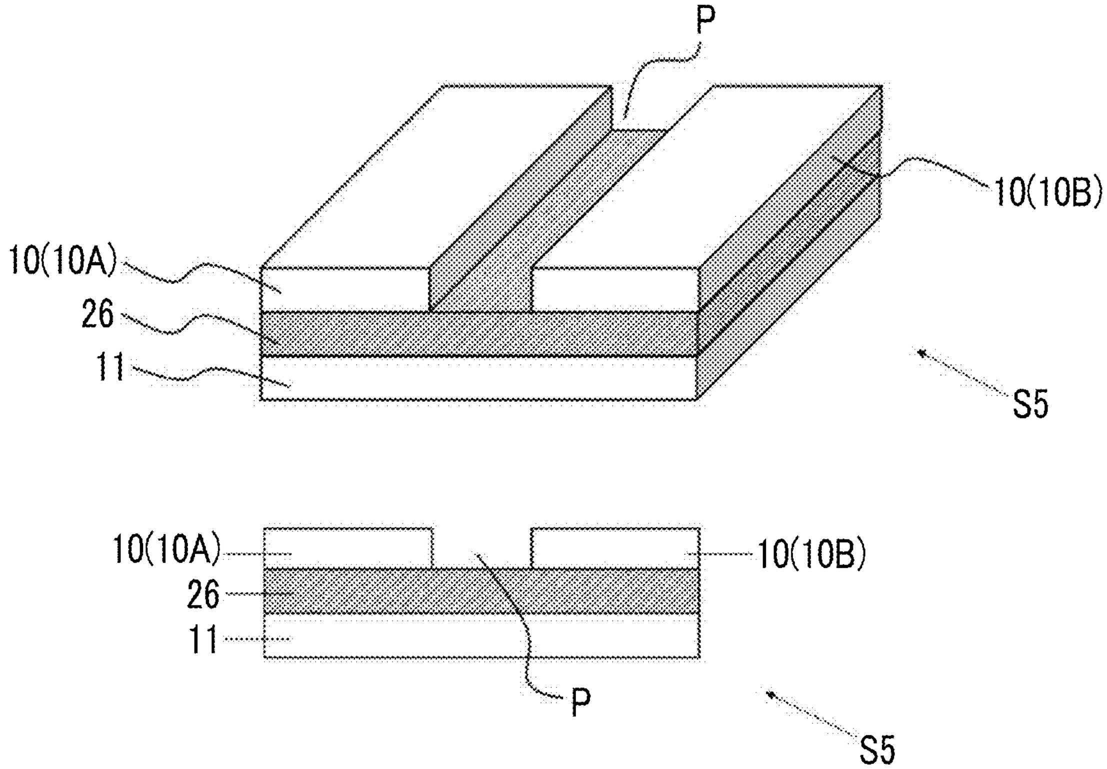
FIG. 5 shows an example of an electromagnetic wave shielding material having a penetrating part.

An electromagnetic wave shielding material S5 illustrated in FIG. 5 includes the metal layer 10 which is the one outermost layer, a magnetic layer 26, and the metal layer 11 which is the other outermost layer. In the electromagnetic wave shielding material S5 illustrated in FIG. 5, the penetrating part P is a penetrating groove, where the one outermost layer (metal layer 10) side is opened to the outside of the laminate. Due to the presence of such a penetrating part (penetrating groove) P, the metal layer 10 is divided into the metal layer 10A and the metal layer 10B in the electromagnetic wave shielding material S5. In contrast, the magnetic layer 26 and the metal layer 11 are continuous layers.

Figure 6:
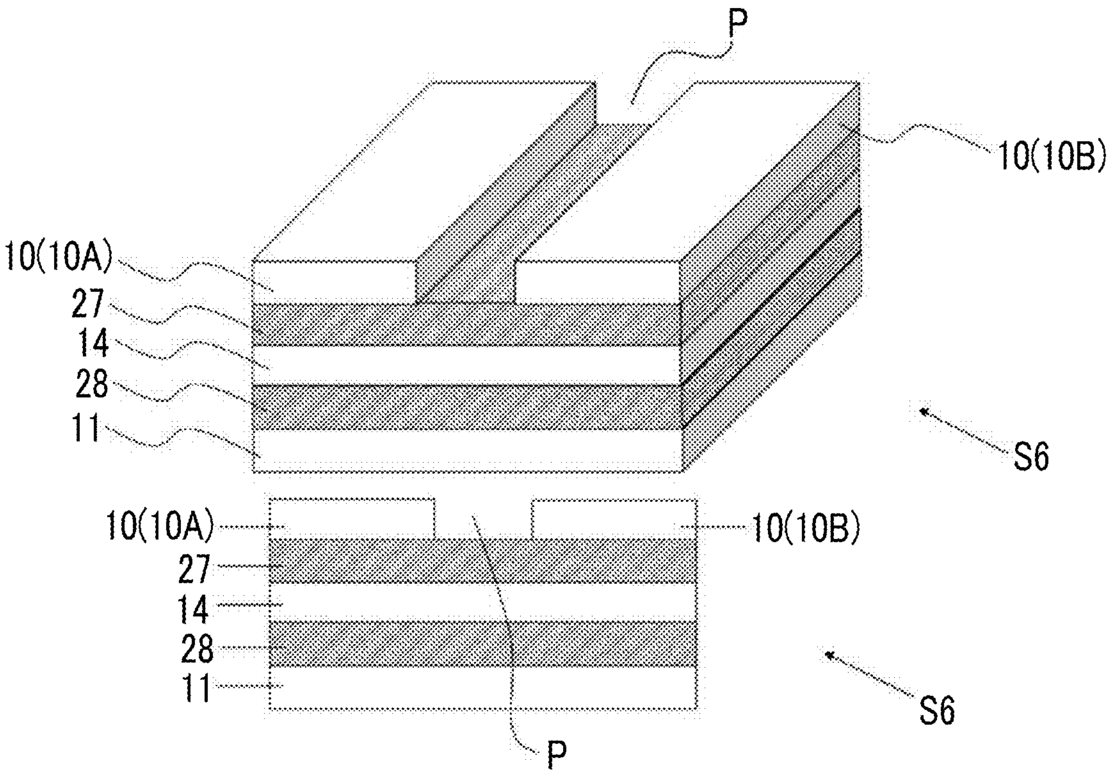
FIG. 6 shows an example of an electromagnetic wave shielding material having a penetrating part.

An electromagnetic wave shielding material S6 illustrated in FIG. 6 includes the metal layer 10 which is the one outermost layer, a magnetic layer 27, an additional metal layer 14, a magnetic layer 28, and the metal layer 11 which is the other outermost layer. In the electromagnetic wave shielding material S6 illustrated in FIG. 6, the penetrating part P is a penetrating groove, where the one outermost layer (metal layer 10) side is opened to the outside of the laminate. Due to the presence of such a penetrating part (penetrating groove) P, the metal layer 10 is divided into the metal layer 10A and the metal layer 10B in the electromagnetic wave shielding material S6. In contrast, all the other four layers constituting the laminate are continuous layers.

In a case where the electromagnetic wave shielding material includes two or more magnetic layers, these two or more magnetic layers may have the same thickness and composition or may have different thicknesses and/or compositions.

Since both outermost layers are metal layers, the electromagnetic wave shielding material includes at least two metal layers and may include one or more additional metal layers. The plurality of metal layers may have the same thickness and composition or may have different thicknesses and/or compositions.

Specific examples of the layer configuration of the laminate include a layer configuration in which a metal layer as one outermost layer, a magnetic layer, and a metal layer as the other outermost layer are provided in this order, as in the cases of the electromagnetic wave shielding material S1 illustrated in FIG. 1, the electromagnetic wave shielding material S3 illustrated in FIG. 3, and the electromagnetic wave shielding material S5 illustrated in FIG. 5.

Specific examples of another layer configuration of the laminate include a layer configuration in which a metal layer as one outermost layer, a magnetic layer, an additional metal layer, a magnetic layer, and a metal layer as the other outermost layer are provided in this order, as in the cases of the electromagnetic wave shielding material S2 illustrated in FIG. 2, the electromagnetic wave shielding material S4 illustrated in FIG. 4, and the electromagnetic wave shielding material S6 illustrated in FIG. 6.

In one form, the electromagnetic wave shielding material can have a penetrating part in a portion other than the one metal layer of both outermost layers. That is, at least one of two metal layers as the outermost layers is not divided by the penetrating part. This point is more preferable from the viewpoint of shielding ability. Examples of such an electromagnetic wave shielding material are the electromagnetic wave shielding materials illustrated in FIGS. 1 to 6, respectively. Examples in which the metal layer of the other outermost layer is not also divided by the penetrating part are the electromagnetic wave shielding material S1 illustrated in FIG. 1 and the electromagnetic wave shielding material S2 illustrated in FIG. 2. In contrast, examples in which the metal layer of one outermost layer is divided by the penetrating part but the metal layer of the other outermost layer is not divided by the penetrating part are the electromagnetic wave shielding materials illustrated in FIGS. 3 to 6, respectively. For example, in one form, the electromagnetic wave shielding material can have, as described above, a penetrating part as a penetrating groove that is located at least in the other metal layer of both outermost layers. Such an electromagnetic wave shielding material is more preferable from the viewpoint of bending performance.

In addition, in one form, the electromagnetic wave shielding material can have a through-hole in a portion other than the metal layers as both outermost layers. Examples of such an electromagnetic wave shielding material are the electromagnetic wave shielding material S1 illustrated in FIG. 1 and the electromagnetic wave shielding material S2 illustrated in FIG. 2. An electromagnetic wave shielding material having such a form is more preferable from the viewpoint of shielding ability since the metal layers as both outermost layers are not divided into two parts.

In another form, the electromagnetic wave shielding material can have a penetrating part as a penetrating groove that is located only in one metal layer of both outermost layers. Such an electromagnetic wave shielding material is more preferable from the viewpoint of shielding ability. Examples thereof are the electromagnetic wave shielding material S5 illustrated in FIG. 5 and the electromagnetic wave shielding material S6 illustrated in FIG. 6.

FIGS. 8 to 11 show, for comparison or reference, examples of electromagnetic wave shielding materials that do not have a penetrating part, and the speculation of the inventors of the present invention regarding the achievement of both the shielding ability and the bending performance is described below.

In an electromagnetic wave shielding material S7 illustrated in FIG. 8, a metal layer 40 is divided into a metal layer 40A and a metal layer 40B, a magnetic layer 30 is divided into a magnetic layer 30A and a magnetic layer 30B, and the metal layer 41 is divided into the metal layer 41A and the metal layer 41B. That is, two laminates are disposed on an installation surface with a gap therebetween.

In an electromagnetic wave shielding material S8 illustrated in FIG. 9, the metal layer 40 is divided into the metal layer 40A and the metal layer 40B, a magnetic layer 31 is divided into a magnetic layer 31A and a magnetic layer 31B, a metal layer 42 is divided into a metal layer 42A and a metal layer 42B, a magnetic layer 32 is divided into a magnetic layer 32A and a magnetic layer 32B, and the metal layer 41 is divided into the metal layer 41A and the metal layer 41B. That is, two laminates are disposed on an installation surface with a gap therebetween.

Figure 10:
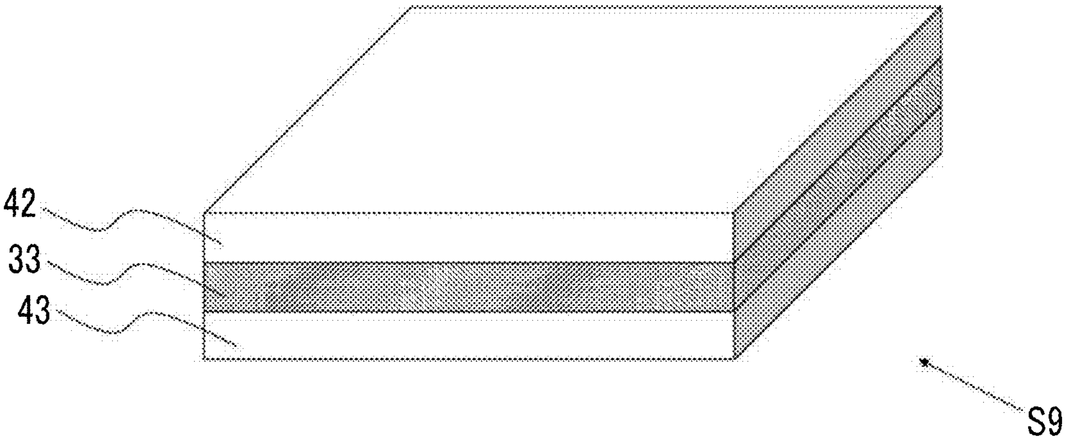
FIG. 10 shows an example of an electromagnetic wave shielding material that does not have a penetrating part.
Figure 10:
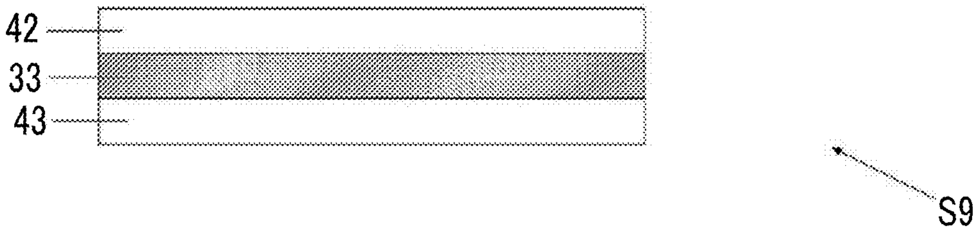

An electromagnetic wave shielding material S9 illustrated in FIG. 10 does not have a penetrating part, and all of the metal layer 42, the magnetic layer 33, and the metal layer 43 are continuous layers.

Figure 11:
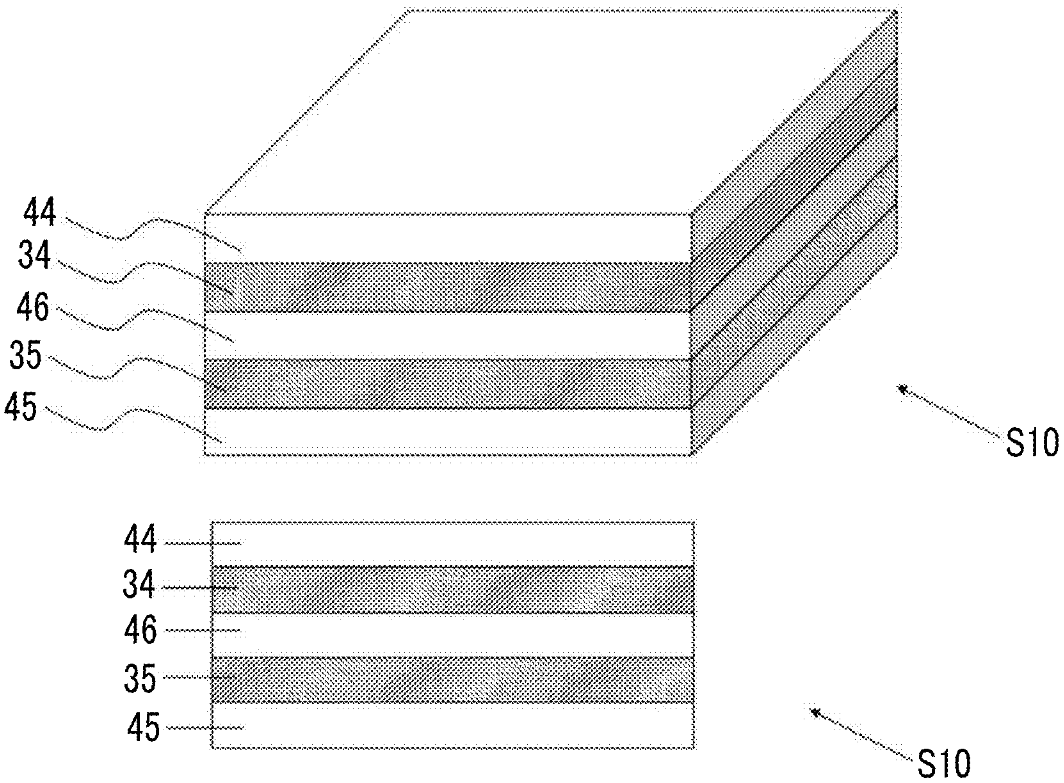
FIG. 11 shows an example of an electromagnetic wave shielding material that does not have a penetrating part.

An electromagnetic wave shielding material S10 illustrated in FIG. 11 does not have a penetrating part, and all of a metal layer 44, a magnetic layer 34, a metal layer 46, a magnetic layer 35, and a metal layer 45 are continuous layers.

For increasing only the shielding ability, it is preferable that the metal layer and the magnetic layer, which are layers that can contribute to the shielding ability, are continuous layers, for example, as in the cases of the electromagnetic wave shielding material S9 illustrated in FIG. 10 and the electromagnetic wave shielding material S10 illustrated in FIG. 11.

However, in a case where all the metal layer and the magnetic layer included in the laminate are continuous layers, it is difficult to bend the laminate during bending processing as described above, and thus the curve width is likely to be widened.

In contrast, since the electromagnetic wave shielding material according to one aspect of the present invention includes a penetrating part that can serve as a so-called folding line, it can be bent to have a narrow curve width as compared with an electromagnetic wave shielding material that does not have such a penetrating part.

On the other hand, in a case where the laminate is completely divided, for example, as in the cases of the electromagnetic wave shielding material S7 illustrated in FIG. 8 and the electromagnetic wave shielding material S8 illustrated in FIG. 9, the shielding ability is significantly reduced as compared with a laminate in which all the layers are continuous layers. In the electromagnetic wave shielding material according to one aspect of the present invention, since the laminate is continuous in at least a part thereof and is not completely divided, it is possible to exhibit a high shielding ability as compared with a laminate that has been completely divided.

In this way, the electromagnetic wave shielding material according to one aspect of the present invention can achieve both the shielding ability and the bending performance.

In the electromagnetic wave shielding material, the width of the penetrating part can be, for example, 20.0 mm or less, and it can be 15.0 mm or less, 10.0 mm or less, 5.0 mm or less, 3.0 mm or less, 1.0 mm or less, less than 1.0 mm, or 0.8 mm or less. In addition, the width of the penetrating part can be, for example, 0.1 mm or more, or 0.3 mm or more. From the viewpoint of suppressing a decrease in the shielding ability as compared with a shielding ability in a case where the penetrating part is not provided, it is preferable that the width of the penetrating part is narrow. From this point, it is preferable that the width of the penetrating part is, for example, 1.0 mm or less. In the present invention and the present specification, "the width of the penetrating part" shall refer to the following value.

Figure 7:
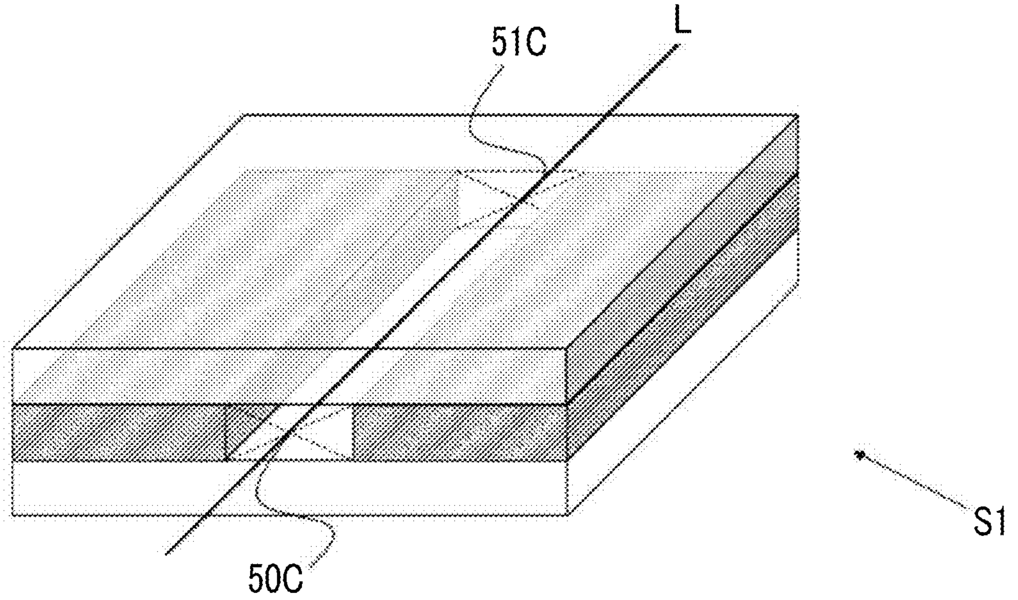
FIG. 7 is an explanatory view of a penetration direction of the penetrating part.

A direction of a straight line that connects centroids of two openings of a penetrating part is called a penetration direction of the penetrating part. FIG. 7 is an explanatory view of a penetration direction of the penetrating part. In FIG. 7, the penetration direction of the penetrating part is shown by taking the electromagnetic wave shielding material S1 illustrated in FIG. 1 as an example. In the electromagnetic wave shielding material S1, the centroid of the opening 50 is 50C, the centroid of the opening 51 is 51C, and a direction of a straight line L connecting 50C and 51C is the penetration direction of the penetrating part. The centroid is a point at which an area moment in a plane figure is zero. In the example illustrated in FIG. 7, the centroid is a position at which two diagonal lines intersect since the opening shape of the opening is a rectangular shape. In a case where the opening shapes are different from each other, centroids are respectively determined according to such shapes. It is noted that all the penetrating parts shown in the drawings described above have linear central axes. However, the present invention is not limited to such examples. In one form, the central axis of the penetrating part can include a curved part in at least a part thereof, and the entire central axis can have a curved shape.

A direction orthogonal to the thickness direction of the electromagnetic wave shielding material (that is, the lamination direction of the laminate) is called a plane direction. In a cross-sectional shape of the penetrating part in the plane direction, in a case where a clearance between the divided portions of the layer that is divided by the penetrating part is constant over the entire penetrating part in a direction orthogonal to the penetration direction of the penetrating part, the clearance is defined as "the width of the through-hole". In a case where the clearance varies depending on the position in the penetrating part, the maximum value thereof is defined as the "width of the penetrating part". In addition, the height of the penetrating part is not particularly limited and can be any height.

Regarding the shielding ability, it is preferable to dispose the electromagnetic wave shielding material at a position at which the direction of the magnetic field is orthogonal to the penetration direction of the penetrating part from the viewpoint of allowing the electromagnetic wave shielding material to exhibit a still more excellent shielding ability. In the present invention and the present specification, the term "orthogonal" in association with the direction of the magnetic field and the penetration direction of the penetrating part shall refer to that intersection occurs at an angle of 90°±10° in a case where an angle in a case of complete orthogonality, that is, in a case of intersection at an angle of 90°, is set to 90°. In a case where intersection is allowed to occur at 90°±10°, most of the magnetic field component (for example, 85% or more) can be made incident on a portion other than the penetrating part of the electromagnetic wave shielding material, and thus it is possible to allow the electromagnetic wave shielding material to exhibit a still more excellent shielding ability. From the viewpoint of further improving the shielding ability, it is more preferable to dispose the electromagnetic wave shielding material, in which the width of the penetrating part is less than 1.0 mm, at a position where the direction of the magnetic field is orthogonal to the penetration direction of the penetrating part.

Hereinafter, various layers that may be included in the electromagnetic wave shielding material will be described in more detail.

<Magnetic Layer>

The magnetic layer can be a layer containing a magnetic material. Examples of the magnetic material include magnetic particles. The magnetic particles can be one kind selected from the group consisting of magnetic particles generally called soft magnetic particles, such as metal particles and ferrite particles, or two or more kinds thereof. Since the metal particles generally have a saturation magnetic flux density of about 2 to 3 times as compared with ferrite particles, the metal particles can maintain specific magnetic permeability and exhibit shielding ability even under a strong magnetic field without magnetic saturation. Therefore, the magnetic particles to be contained in the magnetic layer are preferably metal particles. In the present invention and the present specification, a layer containing metal particles as the magnetic particles shall correspond to the "magnetic layer".

Metal Particle

In the present invention and the present specification, the "metal particle" includes a pure metal particle consisting of a single metal element, a particle of an alloy of one or more metal elements, one or two or more other metal elements, and/or a non-metal element. The metal particle may or may not be crystalline. That is, the metal particle may be a crystalline particle or may be an amorphous particle. Examples of the element of the metal or non-metal contained in the metal particles include Ni, Fe, Co, Mo, Cr, Al, Si, B, and P. The metal particle may or may not contain a component other than the constitutional elements of the metal (including the alloy). The metal particle may contain, in addition to the constitutional element of the metal (including the alloy), elements contained in an additive that can be optionally added and/or elements contained in impurities that can be unintentionally mixed in a manufacturing process of the metal particle at any content. In the metal particle, the content of the constitutional element of the metal (including the alloy) is preferably 90.0% by mass or more and more preferably 95.0% by mass or more, and it may be 100% by mass or may be less than 100% by mass, 99.9% by mass or less, or 99.0% by mass or less.

Examples of the metal particles include particles of Sendust (an Fe—Si—Al alloy), a permalloy (an Fe—Ni alloy), a molybdenum permalloy (an Fe—Ni—Mo alloy), a Fe—Si alloy, a Fe—Cr alloy, an Fe-containing alloy generally called the iron-based amorphous alloy, a Co-containing alloys generally called the cobalt-based amorphous alloy, an alloy generally called the nanocrystal alloy, iron, Permendur (an Fe—Co alloy). Among them, Sendust is preferable since it exhibits a high saturation magnetic flux density and a high specific magnetic permeability.

In one form, a magnetic layer that exhibits a high magnetic permeability (specifically, a real part of a complex specific magnetic permeability) is preferable. In a case where a complex specific magnetic permeability is measured by a magnetic permeability measuring apparatus, a real part μ' and an imaginary part μ' are generally displayed. In the present invention and the present specification, a real part of a complex specific magnetic permeability shall refer to such a real part μ'. Hereinafter, a real part of a complex specific magnetic permeability at a frequency of 300 kHz is also simply referred to as "magnetic permeability". The magnetic permeability can be measured by a commercially available magnetic permeability measuring apparatus or a magnetic permeability measuring apparatus having a known configuration. From the viewpoint that still more excellent electromagnetic wave shielding ability can be exhibited, it is preferable that the magnetic layer located between the two metal layers is a magnetic layer having a magnetic permeability (the real part of the complex specific magnetic permeability at a frequency of 300 kHz) of 30 or more. The magnetic permeability thereof is more preferably 40 or more, still more preferably 50 or more, still more preferably 60 or more, still more preferably 70 or more, even more preferably 80 or more, even still more preferably 90 or more, and even further still more preferably 100 or more. In addition, the magnetic permeability can be, for example, 200 or less, 190 or less, 180 or less, 170 or less, or 160 or less, and it can exceed the values exemplified here. The higher the magnetic permeability is, the higher interfacial reflection effect is obtained, which is preferable.

From the viewpoint of forming a magnetic layer that exhibits a high magnetic permeability, the magnetic particle is preferably a particle having a flat shape (flat-shaped particle). In a case of arranging the long side direction of the flat-shaped particles to be closer to a state parallel to the in-plane direction of the magnetic layer, the magnetic layer can exhibit a higher magnetic permeability since the diamagnetic field can be reduced by aligning the long side direction of the particle with the vibration direction of the electromagnetic wave incident orthogonal to the electromagnetic wave shielding material. In the present invention and the present specification, the "flat-shaped particle" refers to a particle having an aspect ratio of 0.20 or less. The aspect ratio of the flat-shaped particles is preferably 0.15 or less, and more preferably 0.10 or less. The aspect ratio of the flat-shaped particles can be, for example, 0.01 or more, 0.02 or more, or 0.03 or more. It is possible to make the shape of the particle flat-shaped, for example, by carrying out the flattening process according to a known method. For the flattening process, for example, the description of JP2018-131640A can be referenced, specifically, the description of paragraphs 0016 and 0017 and the description of Examples of the same publication can be referenced. Examples of the magnetic layer that exhibits a high magnetic permeability include a magnetic layer containing flat-shaped particles of Sendust.

As described above, from the viewpoint of forming a layer that exhibits a high magnetic permeability as the magnetic layer, it is preferable to arrange the long side direction of the flat-shaped particles to be closer to a state parallel to the in-plane direction of the magnetic layer. From this point, the alignment degree which is a sum of an absolute value of the average value of alignment angles of the flat-shaped particles with respect to the surface of the magnetic layer and a variance of the alignment angles is preferably 30° or lower, more preferably 25° or lower, still more preferably 20° or lower, and even still more preferably 15° or lower. The alignment degree Can be, for example, 3° or higher, 5° or higher, or 10° or higher, and it can be lower than the values exemplified here. A method of controlling the alignment degree will be described later.

In the present invention and the present specification, the aspect ratio of the magnetic particle and the alignment degree are determined according to the following methods.

A cross section of a magnetic layer is exposed according to a known method. A cross-sectional image is acquired as an SEM image regarding a randomly selected region of the cross-section. The imaging conditions are set to be an acceleration voltage of 2 kV and a magnification of 1,000 times, and an SEM image is obtained as the backscattered electron image.

Reading is carried out in grayscale with the cv2. imread ( ) function of Image processing library OpenCV 4 (manufactured by Intel Corporation) by setting the second argument to 0, and a binarized image is obtained with the cv2. threshold ( ) function, using an intermediate brightness between the high-brightness portion and the low-brightness portion as a boundary. A white portion (high-brightness portion) in the binarized image is defined as a magnetic particle.

Regarding the obtained binarized image, a rotational circumscribed rectangular shape corresponding to a portion of each magnetic particle is determined according to the cv2. minAreaRect ( ) function, and the long side length, the short side length, and the rotation angle are determined as the return values of the cv2. minAreaRect ( ) function. In a case of determining the total number of magnetic particles included in the binarized image, it shall be assumed that particles in which only a part of the particle is included in the binarized image are also included. Regarding the particles in which only a part of the particle is included in the binarized image, the long side length, the short side length, and the rotation angle of the portion included in the binarized image are determined. The ratio of the short side length to the long side length (short side length/long side length) determined in this way shall be denoted as the aspect ratio of each magnetic particle. In the present invention and the present specification, in a case where the number of magnetic particles which have an aspect ratio of 0.20 or less and is defined as flat-shaped particles is 10% or more on a number basis with respect to the total number of magnetic particles included in the binarized image, it shall be determined that the magnetic layer is a "magnetic layer including flat-shaped particles as the magnetic particles". In addition, from the rotation angle determined as above, an "alignment angle" is determined as a rotation angle with respect to a horizontal plane (the surface of the magnetic layer).

Particles having an aspect ratio of 0.20 or less, which are determined in the binarized image, are defined as flat-shaped particles. Regarding the alignment angles of all the flat-shaped particles included in the binarized image, the sum of the absolute value of the average value (arithmetic average) and the variance is determined. The sum determined in this way is referred to as the "alignment degree". It is noted that the coordinates of the circumscribed rectangle are calculated using the cv2. boxPoints ( ) function, and an image in which the rotational circumscribed rectangle is superposed on the original image is created according to the cv2. drawContours ( ) function, where a rotational circumscribed rectangle that is erroneously detected clearly is excluded from the calculation of the aspect ratio and the alignment degree. In addition, an average value (arithmetic average) of the aspect ratios of the particles defined as the flat-shaped particles shall be denoted as the aspect ratio of the flat-shaped particles to be contained in a magnetic layer to be measured. Such an aspect ratio is 0.20 or less, preferably 0.15 or less, and more preferably 0.10 or less. In addition, the aspect ratio can be, for example, 0.01 or more, 0.02 or more, or 0.03 or more.

The content of the magnetic particles in the magnetic layer is, for example, 50% by mass or more, 60% by mass or more, 70% by mass or more, and 80% by mass or more with respect to the total mass of the magnetic layer, and it can be, for example, 100% by mass or less, 98% by mass or less, or 95% by mass or less.

In one form, as the magnetic layer, a sintered body (a ferrite plate) of ferrite particles or the like can be used. Considering that, for example, there is a case where the electromagnetic wave shielding material is cut out to a desired size and there is a case where the electromagnetic wave shielding material is bent into a desired shape, the magnetic layer is preferably a layer that contains a resin as compared with a ferrite plate which is a sintered body.

In one form, the magnetic layer located between the two metal layers can be a layer having insulating properties. In the present invention and the present specification, the "insulating properties" associated with the magnetic layer refer to that the electrical conductivity is smaller than 1 siemens (S)/m. The electrical conductivity of a certain layer is calculated according to the following expression from the surface electrical resistivity of the layer and the thickness of the layer. The electrical conductivity can be measured by a known method.

$$\text{Electrical conductivity } [S/m]=1/(\text{surface electrical resistivity } [\Omega]\times\text{thickness } [m])$$

The inventors of the present invention presume that it is preferable that the magnetic layer is a layer having insulating properties in order for the electromagnetic wave shielding material to exhibit a higher electromagnetic wave shielding ability. From this point, the electrical conductivity of the magnetic layer is preferably smaller than 1 S/m, more preferably 0.5 S/m or less, still more preferably 0.1 S/m or less, and even still more preferably 0.05 S/m or less. The electrical conductivity of the magnetic layer can be, for example, $1.0\times10^{-12}$ S/m or more or $1.0\times10^{-10}$ S/m or more.

(Resin)

The magnetic layer can be a layer containing a resin. For example, in the magnetic layer containing the magnetic particles and the resin, the content of the resin can be, for example, 1 part by mass or more, 3 parts by mass or more, or 5 parts by mass or more per 100 parts by mass of the magnetic particles, and it can be 20 parts by mass or less or 15 parts by mass or less.

The resin can act as a binder in the magnetic layer. In the present invention and the present specification, the "resin" means a polymer, and it shall include rubber and an elastomer as well. The polymer includes a homopolymer and a copolymer. The rubber includes natural rubber and synthetic rubber. The elastomer is a polymer that exhibits elastic deformation. Examples of the resin to be contained in the magnetic layer include known thermoplastic resins in the related art, a thermosetting resin, an ultraviolet curable resin, a radiation curable resin, a rubber-based material, and an elastomer. Specific examples thereof include a polyester resin, a polyethylene resin, a polyvinyl chloride resin, a polyvinyl butyral resin, a polyurethane resin, a cellulose resin, an acrylonitrile-butadiene-styrene (ABS) resin, a nitrile-butadiene rubber, a styrene-butadiene rubber, an epoxy resin, a phenol resin, an amide resin, a styrene-based elastomer, an olefin-based elastomer, a vinyl chloride-based elastomer, a polyester-based elastomer, a polyamide-based elastomer, a polyurethane-based elastomer, and an acrylic elastomer.

In addition to the above-described components, the magnetic layer can also contain any amount of one or more known additives such as a curing agent, a dispersing agent, a stabilizer, and a coupling agent.

The magnetic layer included in the electromagnetic wave shielding material can be a continuous layer in one form, can be a layer divided by a penetrating part in another form, and can also be a layer, in which a groove (that is, a recessed part) is formed by locating a penetrating part only in a part of a thickness direction, in another form. This point shall apply to each of a case of one magnetic layer in a case where only one magnetic layer is included, and a case of two or more magnetic layers in a case where two or more magnetic layers are included, independently.

<Metal Layer>

In the electromagnetic wave shielding material, the metal layer can be a layer that contains one or more kinds of metals selected from the group consisting of various pure metals and various alloys. The metal layer can exhibit an attenuation effect in the shielding material. Since the attenuation effect increases as the propagation constant increases and the propagation constant increases as the electrical conductivity increases, it is preferable that the metal layer contains a metal element having a high electrical conductivity. From this point, it is preferable that the metal layer contains a pure metal of Ag, Cu, Au, Al, or Mg, or an alloy containing any one of these as a main component. The pure metal is a metal consisting of a single metal element and may contain a trace amount of impurities. In general, a metal having a purity of 99.0% or more consisting of a single metal element is called a pure metal. The purity is based on mass. The alloy is generally prepared by adding one or more kinds of metal elements or non-metal elements to a pure metal to adjust the composition, for example, in order to prevent corrosion or improve the hardness. The main component in the alloy is a component having the highest ratio on a mass basis, and it can be, for example, a component that occupies 80.0% by mass or more (for example, 99.8% by mass or less) in the alloy. From the viewpoint of economic efficiency, the alloy is preferably an alloy of a pure metal of Cu or Al or an alloy containing Cu or Al as a main component, and from the viewpoint of high electrical conductivity, it is preferably an alloy of a pure metal of Cu or an alloy containing Cu as a main component.

The purity of the metal in the metal layer, that is, the content of the metal can be 99.0% by mass or more, where it is preferably 99.5% by mass or more, and more preferably 99.8% by mass or more with respect to the total mass of the metal layer. Unless otherwise specified, the content of metal in the metal layer shall refer to the content on a mass basis. For example, as the metal layer, a pure metal or an alloy processed into a sheet shape can be used. For example, as the metal layer, a commercially available metal foil or a metal foil produced by a known method can be used. Regarding a pure metal of Cu, sheets (so-called copper foils) having various thicknesses are commercially available. For example, such a copper foil can be used as the metal layer. The copper foil includes, according to manufacturing methods thereof, an electrolytic copper foil obtained by precipitating a copper foil on a cathode by electroplating and a rolled copper foil obtained by applying heat and pressure to an ingot and stretching the ingot thinly. Any copper foil can be used as the metal layer of the electromagnetic wave shielding material. In addition, for example, sheets (so-called aluminium foils) having various thicknesses are commercially available regarding Al as well. For example, such an aluminum foil can be used as the metal layer.

From the viewpoint of reducing the weight of the electromagnetic wave shielding material, one or both (preferably both) of the two metal layers included in the multilayer structure is preferably a metal layer containing a metal selected from the group consisting of Al and Mg. This is because a value (specific gravity/electrical conductivity) obtained by dividing the specific gravity by the electrical conductivity is small both in Al and Mg. As a metal in which this value is smaller is used, the weight of the electromagnetic wave shielding material that exhibits a high shielding ability can be further reduced. As a value calculated from the literature value, for example, a value (specific gravity/electrical conductivity) obtained by dividing the specific gravity by the electrical conductivity of each of Cu, Al, and Mg is as follows. Cu: $1.5\times10^{-7}$ m/S, Al: $7.6\times10^{-8}$ m/S, Mg: $7.6\times10^{-8}$ m/S. From the above values, it can be said that Al and Mg are preferred metals from the viewpoint of reducing the weight of the electromagnetic wave shielding material. The metal layer containing a metal selected from the group consisting of Al and Mg can contain only one of Al and Mg in one form and can contain both in another form. From the viewpoint of reducing the weight of the electromagnetic wave shielding material, one or both (preferably both) of the two metal layers included in the multilayer structure are preferably a metal layer in which the content of the metal selected from the group consisting of Al and Mg is 80.0% by mass or more, and still more preferably a metal layer in which the content of the metal selected from the group consisting of Al and Mg is 90.0% by mass or more. The metal layer containing at least Al among Al and Mg can be a metal layer in which the Al content is 80.0% by mass or more, and it can be a metal layer in which the Al content is 90.0% by mass or more. The metal layer containing at least Mg among Al and Mg can be a metal layer in which the Mg content is 80.0% by mass or more, and it can be a metal layer in which the Mg content is 90.0% by mass or more. The content of the metal selected from the group consisting of Al and Mg, the Al content, and the Mg content can be each, for example, 99.9% by mass or less. The content of the metal selected from the group consisting of Al and Mg, the Al content, and the Mg content are each the content with respect to the total mass of the metal layer.

The plurality of metal layers included in the electromagnetic wave shielding material can be each independently a continuous layer in one form, can be a layer divided by a penetrating part in another form, and can also be a layer, in which a groove (that is, a recessed part) is formed by locating a penetrating part only in a part of a thickness direction, in another form.

<Various Thicknesses>

From the viewpoint of the processability of the metal layer and the shielding ability of the electromagnetic wave shielding material, the thickness of the metal layer in terms of the thickness per one layer is preferably 4 μm or more, more preferably 5 μm or more, still more preferably 10 μm or more, still more preferably 15 μm or more, even still more preferably 20 μm or more, and even still more preferably 30

μm or more. On the other hand, from the viewpoint of the processability of the metal layer, the thickness of the metal layer in terms of the thickness per one layer is preferably 150 μm or less, more preferably 120 μm or less, still more preferably 100 μm or less, and even still more preferably 80 μm or less.

In a case where the thickness of one metal layer of the two metal layers that are located adjacently to each other sandwich the magnetic layer is denoted as T1, the thickness of the other metal layer is denoted as T2, and T1 is equal to or larger than T2 (that is, T1=T2 or T1>T2), the ratio (T2/T1) of the thickness between the two metal layers can be, for example, 0.10 or more, and it is preferably 0.15 or more, more preferably 0.30 or more, still more preferably 0.50 or more, still more preferably 0.70 or more, and even still more preferably 0.80 or more, from the viewpoint that a higher shielding ability can be exhibited with respect to the magnetic field wave. From the viewpoint that a still higher shielding ability can be exhibited with respect to the magnetic field wave, it is preferable that the difference between T1 and T2 is smaller. The thickness ratio (T2/T1) can be 1.00 or less and can also be 1.00 (that is, T1=T2). In a case where the electromagnetic wave shielding material includes two or more laminated structures having a magnetic layer between two metal layers, the above description associated with the thickness ratio (T2/T1) can be applied to at least one of the laminated structures included in the electromagnetic wave shielding material, can be applied to two or more of them, and can be applied to all of them.

The total thickness of the metal layers included in the electromagnetic wave shielding material is preferably 300 μm or less, more preferably 250 μm or less, still more preferably 200 μm or less, still more preferably 150 μm or less, even still more preferably 120 μm or less, even further still more preferably 100 μm or less, and even further still more preferably 80 μm or less. The total thickness of the metal layers included in the electromagnetic wave shielding material can be, for example, 8 μm or more or 10 μm or more.

Regarding the thickness of the magnetic layer, the thickness per layer can be, for example, 3 μm or more, where it is preferably 10 μm or more and more preferably 20 μm or more, from the viewpoint of the shielding ability of the electromagnetic wave shielding material. In addition, from the viewpoint of processability of the electromagnetic wave shielding material, the thickness of the magnetic layer per layer can be, for example, 90 μm or less, where it is preferably 70 μm or less and more preferably 50 μm or less. In a case where the electromagnetic wave shielding material includes two or more layers of the magnetic layers, the total thickness of the magnetic layers included in the electromagnetic wave shielding material can be, for example, 6 μm or more and it can be, for example, 180 μm or less.

In addition, the overall thickness of the shielding material can be, for example, 300 μm or less. From the viewpoint of making the curve width narrow, it is also preferable that the overall thickness of the shielding material is small. From this point, the overall thickness of the electromagnetic wave shielding material is preferably 250 μm or less, more preferably 200 μm or less, and still more preferably 150 μm or less. The overall thickness of the electromagnetic wave shielding material can be, for example, 30 μm or more or 40 μm or more.

The thickness of each layer included in the electromagnetic wave shielding material shall be determined by imaging a cross section exposed by a known method with a scanning electron microscope (SEM) and determining an arithmetic average of thicknesses of five randomly selected points in the obtained SEM image.

<Production of Laminate>

(Film Forming Method for Magnetic Layer)

As described above, the electromagnetic wave shielding material is a laminate. Such a laminate can be produced, for example, by directly bonding the magnetic layer and the metal layer or by bonding them with a pressure-sensitive adhesive layer and/or an adhesive layer, which will be described later, being interposed therebetween. The magnetic layer for being bonded to the metal layer can be produced, for example, by drying a coating layer that is proved by applying a composition for forming a magnetic layer. The composition for forming a magnetic layer contains the components described above and can optionally contain one or more kinds of solvents. Examples of the solvent include various organic solvents, for example, ketone-based solvents such as acetone, methyl ethyl ketone, and cyclohexanone, acetic acid ester-based solvents such as ethyl acetate, butyl acetate, cellosolve acetate, propylene glycol monomethyl ether acetate, and carbitol acetate, carbitols such as cellosolve and butyl carbitol, aromatic hydrocarbon-based solvents such as toluene and xylene, and amide-based solvents such as dimethylformamide, dimethylacetamide, and N-methylpyrrolidone. One kind of solvent or two or more kinds of solvents selected in consideration of the solubility of the component that is used in the preparation of the composition for forming a magnetic layer can be mixed at any ratio and used. The solvent content of the composition for forming a magnetic layer is not particularly limited and may be determined in consideration of the coatability of the composition for forming a magnetic layer.

The composition for forming a magnetic layer can be prepared by sequentially mixing various components in any order or simultaneously mixing them. In addition, as necessary, a dispersion treatment can be carried out using a known dispersing machine such as a ball mill, a bead mill, a sand mill, or a roll mill, and/or a stirring treatment can be also carried out using a known stirrer such as a shaking type stirrer.

The composition for forming a magnetic layer can be applied onto, for example, a support. The coating can be carried out using a known coating device such as a blade coater or a die coater. The coating can be carried out by a so-called roll-to-roll method or a batch method.

Examples of the support onto which the composition for forming a magnetic layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. For these resin films, reference can be made to paragraphs 0081 to 0086 of JP2015-187260A. As the support, it is possible to use a support in which a surface (a surface to be coated) onto which the composition for forming a magnetic layer is applied is subjected to a peeling treatment according to a known method. One form of the peeling treatment includes forming a release layer. For the release layer, reference can be made to paragraph 0084 of JP2015-187260A. In addition, a commercially available peeling-treated resin film can also be used as the support. In a case of using a support in which the surface to be coated is subjected to the peeling treatment, it is possible to easily separate the magnetic layer and the support after the film formation.

In one form, it is also possible to directly apply the composition for forming a magnetic layer onto the metal layer using the metal layer as a support. In a case of directly applying the composition for forming a magnetic layer onto the metal layer, it is possible to manufacture a laminated structure of the metal layer and the magnetic layer in one step.

A coating layer formed by applying the composition for forming a magnetic layer can be subjected to a drying treatment according to a known method such as heating or warm air blowing. The drying treatment can be carried out, for example, under conditions in which the solvent contained in the composition for forming a magnetic layer can be volatilized. As an example, the drying treatment can be carried out for 1 minute to 2 hours in a heated atmosphere having an atmospheric temperature of 80° C. to 150° C.

The alignment degree of the flat-shaped particle described above can be controlled by a solvent kind, solvent amount, liquid viscosity, coating thickness, and the like of the composition for forming a magnetic layer. For example, in a case where the boiling point of the solvent is low, convection occurs due to drying, and thus the value of the alignment degree tends to be large. In a case where the solvent amount is small, the value of the alignment degree tends to increase due to physical interference between adjacent flat-shaped particles. On the other hand, in a case where the liquid viscosity is low, the rotation of flat-shaped particles is difficult to occur, and thus the value of the alignment degree tends to be small. The value of the alignment degree tends to be small as the coating thickness decreases. In addition, carrying out a pressurization treatment described later can contribute to reducing the value of the alignment degree. In a case of adjusting the various manufacturing conditions described above, the alignment degree of the flat-shaped particles can be controlled within the range described above.

(Pressurization Treatment of Magnetic Layer)

The magnetic layer can also be subjected to a pressurization treatment after film formation. In a case of subjecting the magnetic layer containing the magnetic particles to a pressurization treatment, it is possible to increase the density of the magnetic particles in the magnetic layer, and it is possible to obtain a higher magnetic permeability. In addition, in the magnetic layer containing the flat-shaped particles, it is possible to reduce the value of the alignment degree by the pressurization treatment, and it is possible to obtain a higher magnetic permeability.

The pressurization treatment can be carried out by applying pressure in the thickness direction of the magnetic layer using a flat plate pressing machine, a roll pressing machine, or the like. In the flat plate pressing machine, an object to be pressurized is disposed between two flat press plates that are disposed vertically, and the two press plates are put together by mechanical or hydraulic pressure to apply pressure to the object to be pressurized. In the roll pressing machine, an object to be pressurized is allowed to pass between the rotating pressurization rolls that are disposed vertically, and at that time, mechanical or hydraulic pressure is applied to the pressurization rolls, or the distance between the pressurization rolls is made to be smaller than the thickness of the object to be pressurized, whereby the pressure can be applied.

The pressure during the pressurization treatment can be set freely. For example, in a case of a flat plate pressing machine, it is, for example, 1 to 50 newtons (N)/mm$^2$. In a case of a roll pressing machine, it is, for example, 20 to 400 N/mm in terms of the linear pressure.

The pressurization time can be set freely. It takes, for example, 5 seconds to 30 minutes in a case where a flat plate pressing machine is used. In a case where a roll pressing machine is used, the pressurization time can be controlled by the transport speed of the object to be pressurized, where the transport speed is, for example, 10 cm/min to 200 m/min.

The materials of the press plate and the pressurization roll can be randomly selected from metal, ceramics, plastic, and rubber.

In the pressurization treatment, it is also possible to carry out a pressurization treatment by applying a temperature to both of upper and lower press plates of a plate-shape pressing machine or one press plate thereof, or one roll of upper and lower rolls of a roll pressing machine. The magnetic layer can be softened by heating, which makes it possible to obtain a high compression effect in a case where pressure is applied. The temperature at the time of heating can be set freely, and it is, for example, 50° C. or higher and 200° C. or lower. The temperature at the time of heating can be the internal temperature of the press plate or the roll. Such a temperature can be measured with a thermometer installed inside the press plate or the roll.

After the heating and pressurization treatment with the plate-shape pressing machine, the press plates can be spaced apart from each other, for example, in a state where the temperature of the press plates is high, whereby the magnetic layer can be taken out. Alternatively, the press plate can be cooled by a method such as water cooling or air cooling while maintaining the pressure, and then the press plates can be spaced apart to take out the magnetic layer.

In the roll pressing machine, the magnetic layer can be cooled immediately after pressing, by a method such as water cooling or air cooling.

It is also possible to repeat the pressurization treatment two or more times.

In a case where the magnetic layer is formed into a film on a release film, it is possible to carry out a pressurization treatment, for example, in a state where the magnetic layer is laminated on the release film. Alternatively, the magnetic layer can also be peeled off from the release film and can be subjected to a pressurization treatment as a single layer of the magnetic layer. In a case where the magnetic layer is formed into a film directly on the metal layer, the pressurization treatment can be carried out in a state where the metal layer and the magnetic layer are superposed. In addition, in a case of carrying out the pressurization treatment in a state where the magnetic layer is disposed between the metal layers, it is also possible to carry out the pressurization treatment of the magnetic layer and the adhesion between the metal layer and the magnetic layer at the same time.

(Bonding of Metal Layer and Magnetic Layer)

The metal layer and the magnetic layer can be directly bonded to each other, for example, by applying pressure and heat to carry out crimping. A flat plate pressing machine, a roll pressing machine, or the like can be used for the crimping. In the crimping step, the magnetic layer is softened, and the contact with the surface of the metal layer is promoted, whereby the two layers adjacent to each other can be bonded to each other. The pressure at the time of crimping can be set freely. It is, for example, 1 to 50 N/mm$^2$ in a case of a flat plate pressing machine. In a case of a roll pressing machine, it is, for example, 20 to 400 N/mm in terms of the linear pressure. The pressurization time at the time of crimping can be set freely. It takes, for example, 5 seconds to 30 minutes in a case where a flat plate pressing machine is used. In a case where a roll pressing machine is used, the pressurization time can be controlled by a transport speed of an object to be pressurized, and the transport speed is, for example, 10 cm/min to 200 m/min. The temperature at the time of crimping can be randomly selected. For example, it is 50° C. or higher and 200° C. or lower.

The metal layer and the magnetic layer can also be bonded by interposing a pressure-sensitive adhesive layer and/or an adhesive layer between layers of the metal layer and the magnetic layer.

In the present invention and the present specification, the "pressure-sensitive adhesive layer" refers to a layer having tackiness on a surface at normal temperature. Here, the "normal temperature" shall be defined as 23° C., and the normal temperature, which will be described later in association with the adhesive layer, shall be also defined as 23° C. In a case where such a layer comes into contact with an adherend, the layer adheres to the adherend due to the adhesive force thereof. In general, the tackiness is the property of exhibiting an adhesive force in a short time after coming into contact with an adherend with a very light force, and in the present invention and the present specification, the above-described "having tackiness" refers to that the result is No. 1 to No. 32 in a tilted ball tack test (measurement environment: a temperature of 23° C. and a relative humidity of 50%) specified in JIS Z 0237: 2009. In a case where another layer is laminated on the surface of the pressure-sensitive adhesive layer, the surface of the pressure-sensitive adhesive layer exposed, for example, by peeling off the other layer can be subjected to the above-described test. In a case where another layer is laminated on each of one surface and the other surface of the pressure-sensitive adhesive layer, the layer on the side of either surface may be peeled off.

As the pressure-sensitive adhesive layer, it is possible to use those obtained by applying a composition for forming a pressure-sensitive adhesive layer containing a pressure sensitive adhesive such as an acrylic pressure sensitive adhesive, a rubber-based pressure-sensitive adhesive, a silicone-based pressure-sensitive adhesive, or a urethane-based pressure-sensitive adhesive and processing it into a film shape.

The composition for forming a pressure-sensitive adhesive layer can be applied onto, for example, a support. The coating can be carried out using a known coating device such as a blade coater or a die coater. The coating can be carried out by a so-called roll-to-roll method or a batch method.

Examples of the support onto which the composition for forming a pressure-sensitive adhesive layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. As the support, it is possible to use a support in which a surface (a surface to be coated) onto which the composition for forming a pressure-sensitive adhesive layer is applied is subjected to a peeling treatment according to a known method. One form of the peeling treatment includes forming a release layer. In addition, a commercially available peeling-treated resin film can also be used as the support. In a case of using a support in which the surface to be coated is subjected to the peeling treatment, it is possible to easily separate the pressure-sensitive adhesive layer and the support after the film formation.

A composition for forming a pressure-sensitive adhesive layer, in which a pressure-sensitive adhesive is dissolved and/or dispersed in a solvent, is applied to a metal layer or a magnetic layer and dried, whereby a pressure-sensitive adhesive layer is laminated on the surface of the metal layer or the magnetic layer.

In addition, a film-shaped pressure-sensitive adhesive layer is superposed with a metal layer or a magnetic layer and pressurized, whereby the pressure-sensitive adhesive layer can be laminated on the surface of the metal layer or the magnetic layer.

A pressure sensitive adhesive tape including a pressure-sensitive adhesive layer can also be used for producing an electromagnetic wave shielding material having a pressure-sensitive adhesive layer. As the pressure sensitive adhesive tape, it is possible to use a double-sided tape. In the double-sided tape, pressure-sensitive adhesive layers are respectively provided on both surfaces of the support, and the pressure-sensitive adhesive layers on both surfaces can each have tackiness at normal temperature. In addition, as the pressure sensitive adhesive tape, it is possible to use a pressure sensitive adhesive tape in which a pressure-sensitive adhesive layer is provided on one surface of a support. Examples of the support include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide, a non-woven fabric, and paper. As the pressure sensitive adhesive tape in which the pressure-sensitive adhesive layer is provided on one surface or both surfaces of a support, it is possible to use a commercially available product, or it is possible to use a double-sided tape produced by a known method.

In the present invention and the present specification, the "adhesive layer" shall refer to a layer having no tackiness on a surface at normal temperature, where the layer flows and follows minute protrusions and recessions on the surface of the adherend by being pressed against the adherend in a state of being heated, thereby exhibiting an adhesive force by the anchoring effect, or generates a chemical bond with the surface of the adherend by a chemical reaction by being pressed against the adherend in a state of being heated, thereby exhibiting an adhesive force. The adhesive layer can be softened and/or undergo a chemical reaction by heating. The above-described "having no tackiness" refers to that the ball of No. 1 does not stop in a tilted ball tack test (measurement environment: a temperature of 23° C. and a relative humidity of 50%) specified in JIS Z 0237: 2009. In a case where another layer is laminated on the surface of the adhesive layer, the surface of the adhesive layer exposed, for example, by peeling off the other layer can be subjected to the above-described test. In a case where another layer is laminated on each of one surface and the other surface of the adhesive layer, the layer on the side of either surface may be peeled off.

A film-shaped resin material can be used as the adhesive layer. A thermoplastic resin and/or a thermosetting resin can be used as the resin material. The thermoplastic resin has the property of being softened by heating and flows and follows minute protrusions and recessions on the surface of the adherend by being pressed against the adherend in a state of being heated, thereby capable of exhibiting an adhesive force due to the anchoring effect, and then it is cooled, whereby the adhered state can be maintained. The thermosetting resin can cause a chemical reaction by heating, where the chemical reaction occurs by heating in a state of being in contact with an adherend, and a chemical bond is formed with the surface of the adherend, whereby an adhesive force can be exhibited.

Examples of the thermoplastic resin include polyethylene (PE), polypropylene (PP), polyvinyl chloride (PVC), polystyrene (PS), polyvinyl acetate, polyurethane, polyvinyl alcohol, an ethylene vinyl acetate copolymer, styrene butadiene rubber, acrylonitrile butadiene rubber, silicone rubber, an olefin-based elastomer (PP), a styrene-based elastomer, an ABS resin, polyethylene terephthalate (PET), polyester such as polyethylene naphthalate (PEN), polycarbonate (PC), an acryl such as polymethyl methacrylate (PMMA), cyclic polyolefin, and triacetyl cellulose (TAC).

Examples of the thermosetting resin include an epoxy resin, a phenol resin, a melamine resin, a thermosetting urethane resin, a xylene resin, and a thermosetting silicone resin.

In a case where the adhesive layer contains a resin having the same main polymer skeleton as the resin contained in the magnetic layer, the compatibility between the resin contained in the magnetic layer and the resin contained in the adhesive layer is increased, which is preferable from the viewpoint of the adhesion between the magnetic layer and the adhesive layer. For example, it is preferable that the magnetic layer contains a polyurethane resin and the adhesive layer also contains the polyurethane resin.

The film-shaped resin material used as the adhesive layer may be a commercially available product or may be a film-shaped resin material produced by a known method.

In one form, a resin or resin precursor dissolved and/or dispersed in a solvent is applied onto the metal layer or the magnetic layer and cured by drying or polymerization, whereby an adhesive layer consisting of a film-shaped resin material can be laminated on the surface of the metal layer or the magnetic layer.

Alternatively, a resin or resin precursor dissolved and/or dispersed in a solvent is applied onto a support and cured by drying or polymerization to form an adhesive layer, which is subsequently peeled off from the support, whereby a film-shaped adhesive layer can be formed.

In addition, a film-shaped adhesive layer is superposed with a metal layer or a magnetic layer and pressurized under heating, whereby the adhesive layer can be laminated on the surface of the metal layer or the magnetic layer.

In a case where the magnetic layer as an adherend is pressurized under heating in a state of being superposed with an adhesive layer of the metal layer having a surface on which the adhesive layer is laminated, it is possible to bond the metal layer and the magnetic layer to each other with the adhesive layer being interposed therebetween.

Alternatively, in a case where the metal layer as an adherend is pressurized under heating in a state of being superposed with an adhesive layer of the magnetic layer having a surface on which the adhesive layer is laminated, it is possible to bond the metal layer and the magnetic layer to each other with the adhesive layer being interposed therebetween.

Alternatively, in a case where the metal layer and the magnetic layer are superposed and pressurized under heating with an adhesive layer which is a film-shaped resin material being provided therebetween, it is possible to bond the metal layer and the magnetic layer to each other with the adhesive layer being interposed therebetween.

The pressurization under heating can be carried out with a flat plate pressing machine, a roll pressing machine, or the like, which has a heating mechanism.

Alternatively, examples of the adhesive means also include the double-sided tape described as a silicone-based base material-less double-sided tape in JP2003-20453A.

The general pressure-sensitive adhesive layer and adhesive layer do not affect the shielding ability of the shielding material, or the influence thereof is as small as negligible. Regarding the pressure-sensitive adhesive layer and the adhesive layer, the thickness per layer is not particularly limited and can be, for example, 1 μm or more and 30 μm or less.

(Formation of Penetrating Part)

The electromagnetic wave shielding material has a penetrating part. For example, as one or more magnetic layers and/or one or more metal layers, layers that have been divided into a plurality of parts are spaced apart from each other to be disposed, with a gap therebetween, on a layer as an adherend during the production of the laminate, whereby a laminate having a penetrating part can be produced. Alternatively, a plurality of continuous layers are laminated to produce a laminate, and then a groove or a hole is formed by a known method, whereby a laminate having a penetrating part can be obtained. The total number of penetrating parts in the electromagnetic wave shielding material can be, for example, 1, 2, or 3.

The electromagnetic wave shielding material can have any shape such as a film shape (also referred to as a sheet shape) and any size. For example, a film-shaped electromagnetic wave shielding material can be bent into any shape and incorporated into an electronic component or an electronic apparatus.

Using Method for Electromagnetic Wave Shielding Material

One aspect of the present invention relates to a using method for the electromagnetic wave shielding material, in which the electromagnetic wave shielding material is disposed at a position at which a direction of a magnetic field is orthogonal to a penetration direction of the penetrating part. The reason why such a using method is preferable is as described above. However, the electromagnetic wave shielding material is not limited to use in the using method described above. For example, the electromagnetic wave shielding material may be used by being disposed at a position at which the direction of the magnetic field is parallel to the penetration direction of the penetrating part. The direction of the magnetic field is determined by a known method. For example, in a case where the electromagnetic wave shielding material is disposed at a position at which a loop surface of a magnetic field antenna and the penetration direction of the penetrating part of the electromagnetic wave shielding material are in the same direction, the direction of the magnetic field and the penetration direction of the penetrating part are orthogonal to each other. This is due to the fact that the direction of the magnetic field generated from the magnetic field antenna is orthogonal to the loop surface of the magnetic field antenna.

Electronic Component

One aspect of the present invention relates to an electronic component including the electromagnetic wave shielding material. In the electronic component, the electromagnetic wave shielding material can be disposed at any position. For the reason described above, it is preferable to dispose the electromagnetic wave shielding material at a position at which the direction of the magnetic field is orthogonal to the penetration direction of the penetrating part.

Examples of the electronic component include an electronic component included in an electronic apparatus such as a mobile phone, a mobile information terminal, and a medical device, and various electronic components such as a semiconductor element, a capacitor, a coil, and a cable. The electromagnetic wave shielding material can be bent into any shape, for example, according to the shape of the electronic component, thereby capable of being disposed in the inside of the electronic component or capable of being disposed as a cover material that covers the outside of the electronic component. Alternatively, it can be bent and then processed into a flat and tubular shape and disposed as a cover material that covers the outside of the cable.

Electronic Apparatus

One aspect of the present invention relates to an electronic apparatus including the electromagnetic wave shielding material. In the electronic apparatus, the electromagnetic wave shielding material can be disposed at any position. For the reason described above, it is preferable to dispose the electromagnetic wave shielding material at a position at which the direction of the magnetic field is orthogonal to the penetration direction of the penetrating part.

Examples of the electronic apparatus include electronic apparatuses such as a mobile phone, a mobile information terminal, and a medical device, electronic apparatuses including various electronic components such as a semiconductor element, a capacitor, a coil, and a cable, and electronic apparatuses in which electronic components are mounted on a circuit board. Such an electronic apparatus can include the electromagnetic wave shielding material as a constitutional member of an electronic component included in the device. In addition, as a constitutional member of the electronic apparatus, the electromagnetic wave shielding material can be disposed in the inside of the electronic apparatus or can be disposed as a cover material that covers the outside of the electronic apparatus. The electromagnetic wave shielding material can be bent into any shape and then disposed on a constitutional member or the like. Alternatively, it can be bent and then processed into a flat and tubular shape and disposed as a cover material that covers the outside of the cable.

Examples of the usage form of the electromagnetic wave shielding material include a usage form in which a semiconductor package on a printed board is coated with a shielding material. For example, "Electromagnetic wave shielding technology in a semiconductor package" (Toshiba Review Vol. 67, No. 2 (2012) P. 8) discloses a method of obtaining a high shielding effect by electrically connecting a side via of an end part of a package substrate and an inner surface of a shielding material in a case where a semiconductor package is coated with a shielding material, thereby carrying out ground wiring. In order to carry out such wiring, it is desirable that the outermost layer of the shielding material on the electronic component side is a metal layer. Since both outermost layers are metal layers, the electromagnetic wave shielding material can be suitably used in a case of carrying out such wiring as described above.

EXAMPLES

Hereinafter, the present invention will be described in more detail with reference to Examples. However, the present invention is not limited to the embodiments shown in Examples.

Example 1

<Preparation of Coating Liquid (Composition for Forming Magnetic Layer)>

To a plastic bottle, the following substances were added and mixed with a shaking type stirrer for 1 hour to prepare a coating liquid;

100 g of Fe—Si—Al flat-shaped magnetic particles (MFS-SUH manufactured by MKT), 27.5 g of a polyurethane resin of a concentration of solid contents of 30% by mass (UR-8300, manufactured by TOYOBO Co., Ltd.), and 233 g of cyclohexanone.

<Production of Magnetic Layer>

(Formation of Film of Magnetic Layer)

A coating liquid was applied onto a peeling surface of a peeling-treated PET film (PET75JOL manufactured by NIPPA Co., Ltd., hereinafter also described as a "release film") with a blade coater having a coating gap of 300 μm and dried for 30 minutes in a drying device having an internal atmospheric temperature of 80° C. to obtain a film-shaped magnetic layer.

(Pressurization Treatment of Magnetic Layer)

Upper and lower press plates of a plate-shape pressing machine (a large-scale hot press TA-200-1W manufactured by YAMAMOTO ENG. WORKS Co., LTD.) were heated to 140° C. (the internal temperature of the press plate), and the magnetic layer on the release film was installed in the center of the press plate together with the release film and held for 10 minutes in a state where a pressure of 4.66 $N/mm^2$ was applied. The upper and lower press plates were cooled to 50° C. (the internal temperature of the press plates) while maintaining the pressure, and then the magnetic layer was taken out together with the release film from the plate-shape pressing machine. The thickness of the magnetic layer formed in this way was 32.0 μm. A sample piece for the following measurement of magnetic permeability and measurement of electrical conductivity was cut out from the magnetic layer from which the release film was already peeled off.

<Production of Electromagnetic Wave Shielding Material (Laminate) S1>

In order to produce a laminate, a magnetic layer having a size of 15 cm×15 cm was cut out from the magnetic layer from which the sample piece was already cut out, and the cut-out magnetic layer was divided into two parts at the center. In this way, the magnetic layer was divided into two parts having a size of 15 cm×7.5 cm.

For forming a laminate, two aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more).

The magnetic layer divided into two parts was superposed on one aluminum foil with a gap of 0.5 mm therebetween, and the other aluminum foil was superposed thereon to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

Protruding parts, each of which had been formed on the two side surfaces in a case where an end part of the magnetic layer had protruded outward from an end part of the aluminum foil of both outermost layers, were cut and removed from the laminate.

In this way, the electromagnetic wave shielding material S1 illustrated in FIG. 1 was produced.

<Measurement of Magnetic Permeability of Magnetic Layer>

In order to measure the magnetic permeability, the magnetic permeability of the magnetic layer cut out into a rectangle of 28 mm×10 mm was determined as a specific magnetic permeability (μ') at 300 kHz using a magnetic permeability measuring apparatus PER01 (manufactured by KEYCOM Corporation). The determined magnetic permeability was 144.

<Measurement of Electrical Conductivity of Magnetic Layer>

A cylindrical main electrode having a diameter of 30 mm was connected to the negative electrode side of a digital super-insulation resistance meter (TR-811A manufactured by Takeda RIKEN Industries), a ring electrode having an inner diameter of 40 mm and an outer diameter of 50 mm was connected to the positive electrode side thereof, the main electrode was installed on a sample piece of the magnetic layer cut out into a rectangle of 60 mm×60 mm, the ring electrode was installed at a position surrounding the main electrode, a voltage of 25 V was applied to both electrodes, and the surface electrical resistivity of the magnetic layer alone was measured. The electrical conductivity of the magnetic layer was calculated from the surface electrical resistivity and the following expression. The calculated electrical conductivity was $1.6\times10^{-5}$ S/m.

Electrical conductivity [$S/m$]=1/(surface electrical resistivity[Ω]×thickness [$m$])

<Acquisition of Cross-Sectional Image of Shielding Material>

Cross-section processing was carried out to expose the cross-section of the shielding material of Example 1 according to the following method.

A shielding material cut out into a rectangle of 3 mm×3 mm was embedded in a resin, and a cross section of the shielding material was cut with an ion milling device (IM4000PLUS manufactured by Hitachi High-Tech Corporation).

The cross-section of the shielding material, which had been exposed in this way, was observed with a scanning electron microscope (SU8220, manufactured by Hitachi High-Tech Corporation) under the conditions of an acceleration voltage of 2 kV and a magnification of 100 times to obtain a backscattered electron image. From the obtained image, the thicknesses of the magnetic layer and the two metal layers (aluminum foils) were measured at five points based on the scale bar, and the arithmetic averages of the respective thicknesses were denoted as the thickness of the magnetic layer and the thickness of each of the two metal layers. As a result of the measurement, it was confirmed that the thickness of each layer is the thickness described above. The point described above also applies to electromagnetic wave shielding materials of Examples and Comparative Examples described below. In addition, in any of the electromagnetic wave shielding materials, the thickness of each magnetic layer was 32.0 μm, and the thickness of each metal layer was 51.5 μm.

<Acquisition of Cross-Sectional Image of Magnetic Layer>

In a cross section of the shielding material of Example 1, which had been exposed by the cross-section processing in the same manner as described above, a portion of the magnetic layer was observed with a scanning electron microscope (SU8220, manufactured by Hitachi High-Tech Corporation) under the conditions of an acceleration voltage of 2 kV and a magnification of 1,000 times, thereby obtaining a backscattered electron image.

<Measurement of Aspect Ratio of Magnetic Particle and Alignment Degree of Flat-Shaped Particle>

Using the backscattered electron image acquired as above, the aspect ratio of the magnetic particles was determined according to the method described above, and the flat-shaped particles were specified from the value of the aspect ratio. As a result of determining, as described above, whether or not the magnetic layer contained flat-shaped particles as the magnetic particles, it was determined that the magnetic layer contains flat-shaped particles. Further, as a result of determining the alignment degree of the magnetic particles specified as the flat-shaped particles, according to the method described above, the alignment degree was 12°. In addition, an average value (arithmetic average) of the aspect ratios of all the particles specified as the flat-shaped particles was determined as the aspect ratio of the flat-shaped particles contained in the magnetic layer. The determined aspect ratio was 0.072.

<Measurement of Shielding Ability (KEC Method)>

The shielding ability of the electromagnetic wave shielding material of Example 1 was measured according to a KEC method as described below. It is noted that KEC is an abbreviation for Kansai Electronic Industry Development Center.

- a signal generator SG-4222 (manufactured by Iwatsu Electric Co., Ltd.) and an input-side connector of a KEC method magnetic field antenna JSE-KEC (manufactured by Techno Science Japan Co., Ltd.) were connected using an N-type cable.

An output-side connector of a broadband amplifier 315 and an input-side connector of a spectrum analyzer RSA3015E-TG (manufactured by RIGOL TECHNOLOGIES, INC.) were connected using an N-type cable.

An electromagnetic wave shielding material (a measurement specimen) as a measurement target was installed between the facing antennas of the KEC method magnetic field antenna at a position at which the center of the antenna substantially coincided with the center of the electromagnetic wave shielding material, in a direction in which any one side of the electromagnetic wave shielding material and the loop surface of the antenna were parallel to each other, the signal generator and the spectrum analyzer were set as shown in Table 1, and a peak button of the spectrum analyzer was pressed to measure the peak voltage of the signal. It is noted that in Table 1, the scale "10 dB/div" indicates 10 dB per division. The "div" is an abbreviation for "division".

The peak voltage was measured in the same manner even in a state where there was no measurement specimen, and the shielding ability was calculated according to the following expression. dB is an abbreviation for decibel, and dBm is an abbreviation for decibel milliwatt.

Shielding ability [dB]=a peak voltage [dBm] in a state where a measurement specimen is not present−a peak voltage [dBm] in a state where a measurement specimen is installed In the measurement, the electromagnetic wave shielding material was disposed so that the loop surface of the KEC method magnetic field antenna and the penetration direction of the penetrating part of the electromagnetic wave shielding material were in the same direction, and the penetrating part of the electromagnetic wave shielding material was disposed substantially in the center of the opening portion (50 mm×50 mm) of the KEC method magnetic field antenna. The direction of the magnetic field is orthogonal to the penetration direction of the penetrating part of the electromagnetic wave shielding material since the direction of the magnetic field generated from the magnetic field antenna is orthogonal to the loop surface of the antenna.

TABLE 1

| Device | Setting | |
|---|---|---|
| Signal generator SG-4222 (manufactured by Iwatsu Electric Co., Ltd.) | Wave form | Sin (sine wave) |
| | Frequency | 300 kilohertz (kHz) |
| | Output impedance | 50 Ω |
| | Output | 7 dBm |
| Spectrum analyzer RSA3015E-TG (manufactured by RIGOL TECHNOLOGIES, INC.) | Start frequency | 295 kHz |
| | Stop frequency | 305 kHz |
| | Reference level | −10 dBm |
| | Scale | 10 dB/div |
| | Resolution band width (RBW) | 10 Hz |
| | Video band width (VBW) | 1 Hz |

Examples 2 to 5

The electromagnetic wave shielding material S1 illustrated in FIG. 1 was produced according to the method described for Example 1, except that the gap which is opened in a case where the magnetic layer divided into two parts is disposed on the aluminum foil was changed to 1.0 mm, 2.0 mm, 5.0 mm, or 10.0 mm, whereby the width of the penetrating part was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to the penetration direction of the penetrating part).

Example 6

In a case where the shielding ability of the electromagnetic wave shielding material produced according to the method described for Example 1 was measured according to the KEC method as described above, the electromagnetic wave shielding material was disposed as follows.

In the measurement, the electromagnetic wave shielding material was disposed so that the loop surface of the KEC method magnetic field antenna and the penetration direction of the penetrating part of the electromagnetic wave shielding material were in the orthogonal direction, and the penetrating part of the electromagnetic wave shielding material was disposed substantially in the center of the opening portion (50 mm×50 mm) of the KEC method magnetic field antenna. The direction of the magnetic field is orthogonal to the penetration direction of the penetrating part of the electromagnetic wave shielding material since the direction of the magnetic field generated from the magnetic field antenna is parallel to the loop surface of the antenna.

Examples 7 to 10

The shielding ability of each of the electromagnetic wave shielding materials produced according to the method described for Examples 2 to 5 was measured according to the method described for Example 6 (the direction of the magnetic field is parallel to the penetration direction of the penetrating part of the electromagnetic wave shielding material).

Example 11

<Production of Electromagnetic Wave Shielding Material (Laminate) S2>

From the magnetic layer produced according to the method described for Example 1, two magnetic layers having a size of 15 cm×15 cm were cut out for producing a laminate. Each of the two magnetic layers were divided into two parts at the center. In this way, each magnetic layer was divided into two parts having a size of 15 cm×7.5 cm.

For forming a laminate, three aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more). Two aluminum foils were not divided, but the remaining one aluminum foil was divided into two parts at the center. In this way, the remaining one aluminum foil was divided into two parts having a size of 15 cm×7.5 cm. Hereinafter, the aluminum foil which has not been divided into two parts is called an “aluminum foil having no gap”. In addition, the magnetic layer which has not been divided into two parts is called a “magnetic layer having no gap”.

On one of the two aluminum foils having no gap, the position of the gap in the magnetic layer divided into two parts, the position of the gap in the aluminum foil divided into two parts, and the position of the gap in the magnetic layer divided into two parts were aligned in this order to be superposed with a gap of 0.5 mm therebetween, and further, the other of the two aluminum foils having no gap was superposed thereon to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

Protruding parts, each of which had been formed on the two side surfaces in a case where other end parts of three layers had protruded outward from the end part of the aluminum foil of both outermost layers, were cut and removed from the laminate.

In this way, the electromagnetic wave shielding material S2 illustrated in FIG. 2 was produced.

<Measurement of Shielding Ability (KEC Method)>

The shielding ability of the electromagnetic wave shielding material of Example 11 was measured according to the method described for Example 1. In the measurement, as described for Example 1, the direction of the magnetic field was made to be orthogonal to the penetration direction of the penetrating part of the electromagnetic wave shielding material.

Examples 12 to 15

The electromagnetic wave shielding material S2 illustrated in FIG. 2 was produced according to the method described for Example 11, except that the gap which is opened in a case where the magnetic layer divided into two parts and the aluminum foil divided into two parts are disposed was changed to 1.0 mm, 2.0 mm, 5.0 mm, or 10.0 mm, whereby the width of the penetrating part was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to the penetration direction of the penetrating part).

Example 16

The shielding ability of the electromagnetic wave shielding materials produced according to the method described for Example 11 was measured according to the method described for Example 6 (the direction of the magnetic field is parallel to the penetration direction of the penetrating part of the electromagnetic wave shielding material).

Examples 17 to 20

The shielding ability of each of the electromagnetic wave shielding materials produced according to the method described for Examples 12 to 15 was measured according to the method described for Example 6 (the direction of the magnetic field is parallel to the penetration direction of the penetrating part of the electromagnetic wave shielding material).

Example 21

<Production of Electromagnetic Wave Shielding Material (Laminate) S3>

From the magnetic layer produced according to the method described for Example 1, a magnetic layer having a size of 15 cm×15 cm was cut out for producing a laminate, and the cut magnetic layer was divided into two parts at the center. In this way, the magnetic layer was divided into two parts having a size of 15 cm×7.5 cm.

For forming a laminate, two aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more). One aluminum foil was not divided, but the other aluminum foil was divided into two parts at the center. In this way, the other aluminum foil was divided into two parts having a size of 15 cm×7.5 cm.

On an aluminum foil having no gap, the position of the gap in the magnetic layer divided into two parts and the position of the gap in the aluminum foil divided into two parts were aligned in this order to be superposed with a gap of 0.5 mm therebetween to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

Protruding parts, each of which had been formed on the two side surfaces in a case where end parts of the magnetic layer and the aluminum foil of one outermost layer had protruded outward from an end part of the aluminum foil of the other outermost layer, were cut and removed from the laminate.

In this way, the electromagnetic wave shielding material S3 illustrated in FIG. 3 was produced.

<Measurement of Shielding Ability (KEC Method)>

The shielding ability of the electromagnetic wave shielding material of Example 21 was measured according to the method described for Example 1. In the measurement, as described for Example 1, the direction of the magnetic field was made to be orthogonal to the penetration direction of the penetrating part of the electromagnetic wave shielding material.

Examples 22 to 25

The electromagnetic wave shielding material S3 illustrated in FIG. 3 was produced according to the method described for Example 21, except that the gap which is opened in a case where the magnetic layer divided into two parts and the aluminum foil divided into two parts are disposed was changed to 1.0 mm, 2.0 mm, 5.0 mm, or 10.0 mm, whereby the width of the penetrating part was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to the penetration direction of the penetrating part).

Example 26

The shielding ability of the electromagnetic wave shielding materials produced according to the method described for Example 21 was measured according to the method described for Example 6 (the direction of the magnetic field is parallel to the penetration direction of the penetrating part of the electromagnetic wave shielding material).

Examples 27 to 30

The shielding ability of each of the electromagnetic wave shielding materials produced according to the method described for Examples 22 to 25 was measured according to the method described for Example 6 (the direction of the magnetic field is parallel to the penetration direction of the penetrating part of the electromagnetic wave shielding material).

Example 31

<Production of Electromagnetic Wave Shielding Material (Laminate) S4>

From the magnetic layer produced according to the method described for Example 1, two magnetic layers having a size of 15 cm×15 cm were cut out for producing a laminate. Each of the two magnetic layers were divided into two parts at the center. In this way, each magnetic layer was divided into two parts having a size of 15 cm×7.5 cm.

For forming a laminate, three aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more). One aluminum foil was not divided, but the remaining two aluminum foil were divided into two parts at the center. In this way, the remaining two aluminum foil were each divided into two parts having a size of 15 cm×7.5 cm.

On an aluminum foil having no gap, the position of the gap in the magnetic layer divided into two parts, the position of the gap in the aluminum foil divided into two parts, the position of the gap in the magnetic layer divided into two parts, and the position of the gap in the aluminum foil divided into two parts were aligned in this order to be superposed with a gap of 0.5 mm therebetween, whereby a laminate was produced.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

Protruding parts, each of which had been formed on the two side surfaces in a case where other end parts of four layers had protruded outward from the end part of the aluminum foil of the other outermost layer, were cut and removed from the laminate.

In this way, the electromagnetic wave shielding material S4 illustrated in FIG. 4 was produced.

<Measurement of Shielding Ability (KEC Method)>

The shielding ability of the electromagnetic wave shielding material of Example 31 was measured according to the method described for Example 1. In the measurement, as described for Example 1, the direction of the magnetic field was made to be orthogonal to the penetration direction of the penetrating part of the electromagnetic wave shielding material.

Examples 32 to 35

The electromagnetic wave shielding material S4 illustrated in FIG. 4 was produced according to the method described for Example 31, except that the gap which is opened in a case where the magnetic layer divided into two parts and the aluminum foil divided into two parts are disposed was changed to 1.0 mm, 2.0 mm, 5.0 mm, or 10.0 mm, whereby the width of the penetrating part was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to the penetration direction of the penetrating part).

Example 36

The shielding ability of the electromagnetic wave shielding materials produced according to the method described for Example 31 was measured according to the method described for Example 6 (the direction of the magnetic field is parallel to the penetration direction of the penetrating part of the electromagnetic wave shielding material).

Examples 37 to 40

The shielding ability of each of the electromagnetic wave shielding materials produced according to the method described for Examples 32 to 35 was measured according to the method described for Example 6 (the direction of the magnetic field is parallel to the penetration direction of the penetrating part of the electromagnetic wave shielding material).

Example 41

<Production of Electromagnetic Wave Shielding Material (Laminate) S5>

From the magnetic layer produced according to the method described for Example 1, a magnetic layer having a size of 15 cm×15 cm was cut out for producing a laminate. This magnetic layer was used as a magnetic layer having no gap, in the production of the following laminate.

For forming a laminate, two aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more). One aluminum foil was not divided, but the other aluminum foil was divided into two parts at the center. In this way, the other aluminum foil was divided into two parts having a size of 15 cm×7.5 cm.

A magnetic layer having no gap was superposed on an aluminum foil having no gap, and the aluminum foil divided into two parts was superposed thereon, with a gap of 0.5 mm therebetween, to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

Protruding parts, each of which had been formed on the two side surfaces in a case where an end part of the aluminum foil of one outermost layer had 08 outward from end parts of the magnetic layer and the aluminum foil of the other outermost layer, were cut and removed from the laminate.

In this way, the electromagnetic wave shielding material S5 illustrated in FIG. 5 was produced.

<Measurement of Shielding Ability (KEC Method)>

The shielding ability of the electromagnetic wave shielding material of Example 41 was measured according to the method described for Example 1. In the measurement, as described for Example 1, the direction of the magnetic field was made to be orthogonal to the penetration direction of the penetrating part of the electromagnetic wave shielding material.

Examples 42 to 45

The electromagnetic wave shielding material S5 illustrated in FIG. 5 was produced according to the method described for Example 41, except that the gap which is opened in a case where the aluminum foil divided into two parts is disposed was changed to 1.0 mm, 2.0 mm, 5.0 mm, or 10.0 mm, whereby the width of the penetrating part was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to the penetration direction of the penetrating part).

Example 46

The shielding ability of the electromagnetic wave shielding materials produced according to the method described for Example 41 was measured according to the method described for Example 6 (the direction of the magnetic field is parallel to the penetration direction of the penetrating part of the electromagnetic wave shielding material).

Examples 47 to 50

The shielding ability of each of the electromagnetic wave shielding materials produced according to the method described for Examples 42 to 45 was measured according to the method described for Example 6 (the direction of the magnetic field is parallel to the penetration direction of the penetrating part of the electromagnetic wave shielding material).

Example 51

<Production of Electromagnetic Wave Shielding Material (Laminate) S6>

From the magnetic layer produced according to the method described for Example 1, two magnetic layers having a size of 15 cm×15 cm were cut out for producing a laminate. These two magnetic layers were used as a magnetic layer having no gap, in the production of the following laminate.

For forming a laminate, three aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more). Two aluminum foils were not divided, but the remaining one aluminum foil was divided into two parts at the center. In this way, the remaining one aluminum foil was divided into two parts having a size of 15 cm×7.5 cm.

An aluminum foil having no gap, a magnetic layer having no gap, an aluminum foil having no gap, and a magnetic layer having no gap were superposed in this order, and the aluminum foil divided into two parts was superposed thereon, with a gap of 0.5 mm therebetween, to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

Protruding parts, each of which had been formed on the two side surfaces in a case where an end part of the aluminum foil of one other outermost layer had protruded outward from the other end parts of four layers, were cut and removed from the laminate.

In this way, the electromagnetic wave shielding material S6 illustrated in FIG. 6 was produced.

<Measurement of Shielding Ability (KEC Method)>

The shielding ability of the electromagnetic wave shielding material of Example 51 was measured according to the method described for Example 1. In the measurement, as described for Example 1, the direction of the magnetic field was made to be orthogonal to the penetration direction of the penetrating part of the electromagnetic wave shielding material.

Examples 52 to 55

The electromagnetic wave shielding material S6 illustrated in FIG. 6 was produced according to the method described for Example 51, except that the gap which is opened in a case where the aluminum foil divided into two parts is disposed was changed to 1.0 mm, 2.0 mm, 5.0 mm, or 10.0 mm, whereby the width of the penetrating part was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to the penetration direction of the penetrating part).

Example 56

The shielding ability of the electromagnetic wave shielding materials produced according to the method described for Example 51 was measured according to the method described for Example 6 (the direction of the magnetic field is parallel to the penetration direction of the penetrating part of the electromagnetic wave shielding material).

Examples 57 to 60

The shielding ability of each of the electromagnetic wave shielding materials produced according to the method described for Examples 52 to 55 was measured according to the method described for Example 6 (the direction of the magnetic field is parallel to the penetration direction of the penetrating part of the electromagnetic wave shielding material).

Comparative Example 1

From the magnetic layer produced according to the method described for Example 1, two magnetic layers having a size of 15 cm×7.5 cm were cut out for producing a laminate.

For forming a laminate, four aluminum foils having a size of 15 cm×7.5 cm were cut out from an aluminum foil having a thickness of 51.5 μm (in accordance with the JIS H4160: 2006 standard, alloy number: 1N30, temper designation: (1)O, Al content: 99.3% by mass or more).

Two laminates, in which an aluminum foil having a size of 15 cm×7.5 cm, a magnetic layer having a size of 15 cm×7.5 cm, and an aluminum foil having a size of 15 cm×7.5 cm superposed in this order, were produced.

Each of the two laminates described above was pressed by the following method.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

The two laminates described above were disposed on an installation surface, with a gap of 0.5 mm therebetween, to produce the electromagnetic wave shielding material S7 illustrated in FIG. 8, which does not have a penetrating part.

<Measurement of Shielding Ability (KEC Method)>

The shielding ability of the electromagnetic wave shielding material of Comparative Example 1 was measured according to the method described for Example 1. In the measurement, as described for Example 1, the direction of the magnetic field was made to be orthogonal to a direction in which the gap of the electromagnetic wave shielding material was opened.

Comparative Examples 2 to 5

The electromagnetic wave shielding material S7 illustrated in FIG. 8 was produced according to the method described for Comparative Example 1, except that the gap in a case where the two laminates were disposed changed to 1.0 mm, 2.0 mm, 5.0 mm, or 10.0 mm, whereby the width of the gap was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to a direction in which the gap is opened).

Comparative Example 6

The shielding ability of the electromagnetic wave shielding materials produced according to the method described for Comparative Example 1 was measured according to the method described for Example 6 (the direction of the magnetic field is parallel to a direction in which the gap of the electromagnetic wave shielding material is opened).

Comparative Examples 7 and 10

The shielding ability of each of the electromagnetic wave shielding materials produced according to the method described for Comparative Examples 2 to 5 was measured according to the method described for Example 6 (the direction of the magnetic field is parallel to a direction in which the gap of the electromagnetic wave shielding material is opened).

Comparative Example 11

From the magnetic layer produced according to the method described for Example 1, four magnetic layers having a size of 15 cm×7.5 cm were cut out for producing a laminate.

For forming a laminate, six aluminum foils having a size of 15 cm×7.5 cm were cut out from an aluminum foil having a thickness of 51.5 μm (in accordance with the JIS H4160: 2006 standard, alloy number: IN30, temper designation: (1)O, Al content: 99.3% by mass or more).

Two laminates, in which an aluminum foil having a size of 15 cm×7.5 cm, a magnetic layer having a size of 15 cm×7.5 cm, an aluminum foil having a size of 15 cm×7.5 cm, a magnetic layer having a size of 15 cm×7.5 cm, and an aluminum foil having a size of 15 cm×7.5 cm were superposed in this order, were produced.

Each of the two laminates described above was pressed by the following method.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 $N/mm^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

The two laminates described above were disposed on an installation surface, with a gap of 0.5 mm therebetween, to produce the electromagnetic wave shielding material S8 illustrated in FIG. 9, which does not have a penetrating part.

<Measurement of Shielding Ability (KEC Method)>

The shielding ability of the electromagnetic wave shielding material of Comparative Example 11 was measured according to the method described for Example 1. In the measurement, as described for Example 1, the direction of the magnetic field was made to be orthogonal to a direction in which the gap of the electromagnetic wave shielding material was opened.

Comparative Examples 12 to 15

The electromagnetic wave shielding material S8 illustrated in FIG. 9 was produced according to the method described for Comparative Example 11, except that the gap in a case where the two laminates were disposed changed to 1.0 mm, 2.0 mm, 5.0 mm, or 10.0 mm, whereby the width of the gap was changed to 1.0 mm, 2.0 mm, 5.0 mm, or 10.0 mm.

The shielding ability of the produced electromagnetic wave shielding material was measured according to the method described for Example 1 (the direction of the magnetic field is orthogonal to a direction in which the gap is opened).

Comparative Example 16

The shielding ability of the electromagnetic wave shielding materials produced according to the method described for Comparative Example 11 was measured according to the method described for Example 6 (the direction of the magnetic field is parallel to a direction in which the gap of the electromagnetic wave shielding material is opened).

Comparative Examples 17 to 20

The shielding ability of each of the electromagnetic wave shielding materials produced according to the method described for Comparative Examples 12 to 15 was measured according to the method described for Example 6 (the direction of the magnetic field is parallel to a direction in which the gap of the electromagnetic wave shielding material is opened).

Comparative Example 21

From the magnetic layer produced according to the method described for Example 1, a magnetic layer having a size of 15 cm×15 cm was cut out for producing a laminate.

For forming a laminate, two aluminum foils having a size of 15 cm×15 cm were cut out from an aluminum foil having a thickness of 51.5 μm (in accordance with the JIS H4160: 2006 standard, alloy number: 1N30, temper designation: (1)O, Al content: 99.3% by mass or more).

An aluminum foil, a magnetic layer, and an aluminum foil were superposed in this order to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 N/mm$^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

In this way, the electromagnetic wave shielding material S9 illustrated in FIG. 10, which does not have a penetrating part, was produced.

<Measurement of Shielding Ability (KEC Method)>

The shielding ability of the electromagnetic wave shielding material of Comparative Example 21 was measured according to the method described for Example 1. It is noted that the electromagnetic wave shielding material of Comparative Example 21 has neither the penetrating part nor the gap. In the measurement, the electromagnetic wave shielding material was disposed at a position at which the center of the antenna substantially coincided with the center of the electromagnetic wave shielding material, in a direction in which any one side of the electromagnetic wave shielding material and the loop surface of the antenna were parallel to each other.

Comparative Example 22

From the magnetic layer produced according to the method described for Example 1, two magnetic layers having a size of 15 cm×15 cm were cut out for producing a laminate.

For forming a laminate, three aluminum foils having a size of 15 cm×15 cm were cut out from an aluminum foil having a thickness of 51.5 μm (in accordance with the JIS H4160: 2006 standard, alloy number: IN30, temper designation: (1)O, Al content: 99.3% by mass or more).

An aluminum foil, a magnetic layer, an aluminum foil, a magnetic layer, and an aluminum foil were superposed in this order to produce a laminate.

Upper and lower press plates of a plate-shape pressing machine (a large-scale hot press TA-200-1W manufactured by YAMAMOTO ENG. WORKS CO., LTD.) were heated to 140° C. (the internal temperature of the press plate), and the laminate was installed in the center of the press plate and held for 10 minutes in a state where a pressure of 4.66 N/mm$^2$ was applied, whereby the aluminum foil and the magnetic layer were subjected to the thermal compression bonding. The upper and lower press plates were cooled to 50° C. (the internal temperature of the press plates) while maintaining the pressure, and then the laminate was taken out from the plate-shape pressing machine.

In this way, the electromagnetic wave shielding material S10 illustrated in FIG. 11, which does not have a penetrating part, was produced.

<Measurement of Shielding Ability (KEC Method)>

The shielding ability of the electromagnetic wave shielding material of Comparative Example 22 was measured according to the method described for Comparative Example 21.

<Measurement of Curve Width>

The curve width was measured by the following method in order to evaluate the bending performance of each of the electromagnetic wave shielding materials of Examples 1 to 60, Comparative Example 21, and Comparative Example 22.

Each of the electromagnetic wave shielding materials was firmly bent in half by hand and then spread out to be flattened. The electromagnetic wave shielding materials of Examples were subjected to the above-described bending by using the penetrating part as a so-called folding line. The electromagnetic wave shielding material having a penetrating groove in the metal layer of the outermost layer or having a penetrating groove over the metal layer of the outermost layer was bent toward the side of the metal layer that did not have a penetrating groove in the above-described bending.

The electromagnetic wave shielding material which was spread after being bent was attached to a slide glass, and the bent portion was observed with an optical microscope (LV150 manufactured by Nikon Corporation) at a magnification of 50 times, and an image was acquired. In the acquired image, a portion which was bright or dark as compared with a place which had not been bent was denoted as the deformed portion, and the width thereof was measured. The width measured in this way was denoted as the curve width.

The above results are shown in Table 2 (Tables 2-1 to 2-3).

TABLE 2-1

| Electromagnetic wave shielding material | Disposition of electromagnetic wave shielding material | Evaluation item | Width of penetrating part: Without penetrating part | 0.5 mm | 1.0 mm | 2.0 mm | 5.0 mm | 10.0 mm |
|---|---|---|---|---|---|---|---|---|
| | | | Comparative Example 21 (S9) | Example 1 | Example 2 | Example 3 | Example 4 | Example 5 |
| S1 | Direction of magnetic field is orthogonal to penetration direction of penetrating part | Shielding ability [dB] | 41.3 | 41.2 | 39.9 | 37.6 | 34.0 | 33.1 |
| | | Curve width | 0.99 | 0.69 | 0.68 | 0.66 | 0.67 | 0.67 |
| | | | | Example 6 | Example 7 | Example 8 | Example 9 | Example 10 |
| S1 | Direction of magnetic field is parallel to penetration direction of penetrating part | Shielding ability [dB] | | 40.9 | 40.1 | 40.1 | 39.8 | 37.9 |
| | | Curve width | | 0.69 | 0.68 | 0.66 | 0.67 | 0.67 |

TABLE 2-1-continued

| Electromagnetic wave shielding material | Disposition of electromagnetic wave shielding material | Evaluation item | Width of penetrating part | | | | | |
|---|---|---|---|---|---|---|---|---|
| | | | Without penetrating part | 0.5 mm | 1.0 mm | 2.0 mm | 5.0 mm | 10.0 mm |
| | | | Comparative Example 22 (S10) | Example 11 | Example 12 | Example | Example 14 | Example 15 |
| S2 | Direction of magnetic field is orthogonal to penetration direction of penetrating part | Shielding ability [dB] | 44.6 | 42.0 | 41.2 | 39.9 | 37.4 | 35.5 |
| | | Curve width | 1.88 | 0.75 | 0.72 | 0.77 | 0.71 | 0.75 |
| | | | | Example 16 | Example 17 | Example 18 | Example 19 | Example 20 |
| S2 | Direction of magnetic field is parallel to penetration direction of penetrating part | Shielding ability [dB] | | 41.4 | 41.6 | 41.3 | 41.1 | 40.4 |
| | | Curve width | | 0.75 | 0.72 | 0.77 | 0.71 | 0.75 |
| | | | | Example 21 | Example 22 | Example 23 | Example 24 | Example 25 |
| S3 | Direction of magnetic field is orthogonal to penetration direction of penetrating part | Shielding ability [dB] | | 37.5 | 37.1 | 34.6 | 29.7 | 25.1 |
| | | Curve width | | 0.57 | 0.56 | 0.58 | 0.54 | 0.54 |
| | | | | Example 26 | Example 27 | Example 28 | Example 29 | Example 30 |
| S3 | Direction of magnetic field is parallel to penetration direction of penetrating part | Shielding ability [dB] | | 28.2 | 29.0 | 28.6 | 27.0 | 25.1 |
| | | Curve width | | 0.57 | 0.56 | 0.58 | 0.54 | 0.54 |

TABLE 2-2

| Electromagnetic wave shielding material | Disposition of electromagnetic wave shielding material | Evaluation item | Without penetrating part | Width of penetrating part | | | | |
|---|---|---|---|---|---|---|---|---|
| | | | | 0.5 mm | 1.0 mm | 2.0 mm | 5.0 mm | 10.0 mm |
| | | | | Example 31 | Example 32 | Example 33 | Example 34 | Example 35 |
| S4 | Direction of magnetic field is orthogonal to penetration direction of penetrating part | Shielding ability [dB] | | 39.1 | 39.0 | 37.5 | 30.0 | 25.8 |
| | | Curve width | | 0.58 | 0.55 | 0.57 | 0.55 | 0.55 |
| | | | | Example 36 | Example 37 | Example 38 | Example 39 | Example 40 |
| S4 | Direction of magnetic field is parallel to penetration direction of penetrating part | Shielding ability [dB] | | 33.3 | 33.2 | 32.2 | 29.4 | 27.4 |
| | | Curve width | | 0.58 | 0.55 | 0.57 | 0.55 | 0.55 |
| | | | | Example 41 | Example 42 | Example 43 | Example 44 | Example 45 |
| S5 | Direction of magnetic field is orthogonal to penetration direction of penetrating part | Shielding ability [dB] | | 37.9 | 36.4 | 35.9 | 33.6 | 33.3 |
| | | Curve width | | 0.81 | 0.78 | 0.78 | 0.8 | 0.84 |
| | | | | Example 46 | Example 47 | Example 48 | Example 49 | Example 50 |
| S5 | Direction of magnetic field is parallel to penetration direction of penetrating part | Shielding ability [dB] | | 28.7 | 28.6 | 27.4 | 27.1 | 25.6 |
| | | Curve width | | 0.81 | 0.78 | 0.78 | 0.8 | 0.84 |
| | | | | Example 51 | Example 52 | Example 53 | Example 54 | Example 55 |
| S6 | Direction of magnetic field is orthogonal to penetration direction of penetrating part | Shielding ability [dB] | | 40.7 | 40.3 | 40.2 | 41.8 | 42.7 |
| | | Curve width | | 1.44 | 1.56 | 1.43 | 1.41 | 1.52 |

TABLE 2-2-continued

| Electromagnetic wave shielding material | Disposition of electromagnetic wave shielding material | Evaluation item | Without penetrating part | Width of penetrating part 0.5 mm | 1.0 mm | 2.0 mm | 5.0 mm | 10.0 mm |
|---|---|---|---|---|---|---|---|---|
| | | | | Example 56 | Example 57 | Example 58 | Example 59 | Example 60 |
| S6 | Direction of magnetic field is parallel to penetration direction of penetrating part | Shielding ability [dB] | | 39.7 | 39.8 | 40.5 | 39.5 | 39.7 |
| | | Curve width | | 1.44 | 1.56 | 1.43 | 1.41 | 1.52 |

TABLE 2-3

| Electromagnetic wave shielding material | Disposition of electromagnetic wave shielding material | Evaluation item | Width of gap: Without penetrating part | 0.5 mm | 1.0 mm | 2.0 mm | 5.0 mm | 10.0 mm |
|---|---|---|---|---|---|---|---|---|
| | | | | Comparative Example 1 | Comparative Example 2 | Comparative Example 3 | Comparative Example 4 | Comparative Example 5 |
| S7 | Direction of magnetic field is orthogonal to penetration direction of penetrating part | Shielding ability [dB] | | 34.7 | 33.9 | 30.6 | 16.9 | 10.1 |
| | | Curve width | | — | — | — | — | — |
| | | | | Comparative Example 6 | Comparative Example 7 | Comparative Example 8 | Comparative Example 9 | Comparative Example 10 |
| S7 | Direction of magnetic field is parallel to penetration direction of penetrating part | Shielding ability [dB] | | 11.9 | 11.1 | 9.7 | 5.9 | 4.3 |
| | | Curve width | | — | — | — | — | — |
| | | | | Comparative Example 11 | Comparative Example 12 | Comparative Example 13 | Comparative Example 14 | Comparative Example 15 |
| S8 | Direction of magnetic field is orthogonal to penetration direction of penetrating part | Shielding ability [dB] | | 32.4 | 32.2 | 29.3 | 18.9 | 10.7 |
| | | Curve width | | — | — | — | — | — |
| | | | | Comparative Example 16 | Comparative Example 17 | Comparative Example 18 | Comparative Example 19 | Comparative Example 20 |
| S8 | Direction of magnetic field is parallel to penetration direction of penetrating part | Shielding ability [dB] | | 14.7 | 14.2 | 12.6 | 8.4 | 5.9 |
| | | Curve width | | — | — | — | — | — |

From the results shown in Table 2, the following points can be confirmed.

In a case where the shielding ability of the electromagnetic wave shielding materials of Examples 1 to 60 is compared with the shielding ability of the electromagnetic wave shielding materials of Comparative Examples which have the same total number of layers of the laminate and have a gap having the same width as the penetrating part, a decrease in the shielding ability as compared with the shielding ability of the electromagnetic wave shielding material (Comparative Example 21 or Comparative Example 22) having the same total number of layers of the laminate and having no penetrating part is small in the shielding materials of Examples.

In the electromagnetic wave shielding materials of Examples 1 to 60 having a penetrating part, the curve width is narrow as compared with the curve width of the electromagnetic wave shielding material (Comparative Example 21 or Comparative Example 22) having the same total number of layers of the laminate and having no penetrating part.

As described above, in the electromagnetic wave shielding materials of Examples 1 to 60, it was possible to achieve both the shielding ability against the electromagnetic wave (magnetic field wave) and the bending performance.

One aspect of the present invention is useful in the technical fields of various electronic components and various electronic apparatuses.

What is claimed is:

1. An electromagnetic wave shielding material, wherein the electromagnetic wave shielding material is a laminate in which both outermost layers are metal layers and one or more magnetic layers are provided, the electromagnetic wave shielding material has a penetrating part that penetrates from a position on one side surface of the laminate to a position on the other side surface thereof, the penetrating part is provided in a portion other than one metal layer of both outermost layers, and the penetrating part is a penetrating groove that is located at least in the other metal layer of both outermost layers and in the magnetic layer.

2. An electronic component comprising:

the electromagnetic wave shielding material according to claim 1.

3. The electronic component according to claim 2, wherein the electromagnetic wave shielding material is disposed at a position at which a direction of a magnetic field is orthogonal to a penetration direction of the penetrating part.

4. An electronic apparatus comprising:

the electromagnetic wave shielding material according to claim 1.

5. The electronic apparatus according to claim 4, wherein the electromagnetic wave shielding material is disposed at a position at which a direction of a magnetic field is orthogonal to a penetration direction of the penetrating part.

6. A using method for the electromagnetic wave shielding material according to claim 1, wherein the electromagnetic wave shielding material is disposed at a position at which a direction of a magnetic field is orthogonal to a penetration direction of the penetrating part.

7. An electromagnetic wave shielding material, wherein the electromagnetic wave shielding material is a laminate in which both outermost layers are metal layers and one or more magnetic layers are provided, the electromagnetic wave shielding material has a penetrating part that penetrates from a position on one side surface of the laminate to a position on the other side surface thereof, and the laminate includes, in the following order;

a metal layer as one outermost layer, a magnetic layer, an additional metal layer, a magnetic layer, and a metal layer as the other outermost layer.

8. An electronic component comprising:

the electromagnetic wave shielding material according to claim 7.

9. The electronic component according to claim 8, wherein the electromagnetic wave shielding material is disposed at a position at which a direction of a magnetic field is orthogonal to a penetration direction of the penetrating part.

10. An electronic apparatus comprising:

the electromagnetic wave shielding material according to claim 7.

11. The electronic apparatus according to claim 10, wherein the electromagnetic wave shielding material is disposed at a position at which a direction of a magnetic field is orthogonal to a penetration direction of the penetrating part.

* * * * *